(12) United States Patent  
Morimoto

(10) Patent No.: US 6,995,999 B2
(45) Date of Patent: Feb. 7, 2006

(54) NONVOLATILE SEMICONDUCTOR MEMORY DEVICE AND CONTROL METHOD THEREOF

(75) Inventor: Hidenori Morimoto, Kashihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/867,950

(22) Filed: Jun. 14, 2004

(65) Prior Publication Data

US 2004/0264244 A1    Dec. 30, 2004

(30) Foreign Application Priority Data

Jun. 12, 2003 (JP) .............................. 2003-168223
Dec. 26, 2003 (JP) .............................. 2003-433815

(51) Int. Cl.
*G11C 11/24* (2006.01)
*G11C 7/00* (2006.01)
(52) U.S. Cl. .................. 365/149; 365/189.01; 365/218
(58) Field of Classification Search .................... None
See application file for complete search history.

(56) References Cited

U.S. PATENT DOCUMENTS

2003/0086285 A1 * 5/2003 Yamaguchi ................. 365/145
2003/0161182 A1 * 8/2003 Li et al. ................. 365/185.02
2004/0114429 A1   6/2004 Ehiro et al.

FOREIGN PATENT DOCUMENTS

EP          1 426 972 A2    6/2004

OTHER PUBLICATIONS

Hsu, S. T. et al. (2003). "Charge Transport Property In Non-Volatile Resistor Random Access Memory (RRAM)," Non-Volatile Semiconductor Memory Workshop, pp. 97-98.
Zhuang, W. W. et al. (2002). "Novell Colossal Magnetoresistive Thin Film Nonvolatile Resistance Random Access Memory (RRAM)," IEDM, Paper No. 7.5 *IEEE*, 4 pages.
European Search Report mailed Jul. 12, 2005 for European Patent Application No. 04253457.8, 3 pages.

* cited by examiner

*Primary Examiner*—Thong Q. Le
(74) *Attorney, Agent, or Firm*—Morrison & Foerster LLP

(57) ABSTRACT

A nonvolatile semiconductor memory device includes a memory array in which a plurality of memory cells are arranged in a row direction and a column direction, each of the memory cells being formed by connecting one end of a variable resistive element for storing information according to a change in electric resistance caused by an electric stress and a drain of a selection transistor to each other on a semiconductor substrate, a voltage switch circuit for switching among a program voltage, an erase voltage and a read voltage to be applied to the source line and the bit line connected to the memory cell, and a pulse voltage applying circuit. In the state where the program voltage or erase voltage corresponding to the bit line and the source line is applied to the bit line and the source line connected to a memory cell to be programmed or erased in the memory array via the voltage switch circuit, the pulse voltage applying circuit applies a voltage pulse for programming or erasing to the word line connected to the gate electrode of the selection transistor connected to the memory cell.

36 Claims, 22 Drawing Sheets

NONVOLATILE SEMICONDUCTOR MEMORY DEVICE AND CONTROL METHOD THEREOF

BACKGROUND OF THE INVENTION

1. Field of the Invention

The present invention relates to a nonvolatile semiconductor memory device having a memory array in which a plurality of memory cells each formed by connecting one end of a variable resistive element for storing information according to a change in electric resistance caused by application of a voltage and a drain of a selection transistor to each other on a semiconductor substrate are arranged in the row direction and the column direction, and a control method thereof. More particularly, the present invention relates to a method of applying a voltage to a memory cell at the time of programming or erasing.

2. Description of the Related Art

In recent years, it is getting easier and easier to obtain information anytime and anywhere and to freely carry the information. Because of spread of mobile apparatuses typified by a portable telephone and a PDA (Personal Digital Assistant), the user can access various information anywhere and anytime. However, performances of the mobile apparatus such as the life of a battery of the mobile apparatus and access speed to information are not sufficiently high yet and there are unlimited demands for improvements in the performances. Particularly, the life of a battery is one of main performances determining the usability of a mobile apparatus, so that reduction in power consumption is strongly requested for the components of a mobile apparatus.

As one of key devices, a nonvolatile semiconductor memory is becoming more and more important. In a mobile apparatus, in an active operation state, power consumption of a logic circuit for executing a logic function is dominant but, in a standby state, power consumption of a memory device is dominant. The power consumption in the standby state is becoming more important as the drive time by a battery of a mobile apparatus increases. By using the nonvolatile semiconductor memory, it becomes unnecessary to supply power to the nonvolatile semiconductor memory in the standby state, so that the power consumption can be reduced to the limit.

Nonvolatile semiconductor memories include a flash memory, an FeRAM (Ferroelectric Random Access Memory) and the like, and many of them are already practically used. Those nonvolatile semiconductor memories have tradeoffs among high speed, rewrite resistance, power consumption and the like. Research and development for an ideal nonvolatile semiconductor memory satisfying all of required specifications are being conducted. Some nonvolatile semiconductor memories using new materials have been already proposed and an RRAM (Resistance Random Access Memory) is one of promising nonvolatile semiconductor memories. Since the RRAM has high potentials of high speed, large capacity, low power consumption and the like, expectations are placed on the future potential of the RRAM.

Zhuang, H. H., et al., "Novel Colossal Magnetoresistive Thin Film Nonvolatile Resistance Random Access Memory (RRAM)", IEDM, Paper No. 7.5, December, 2002 specifically describes an RRAM in which by applying a voltage pulse to an oxide material containing manganese having a perovskite type crystal structure showing CMR (colossal magnetoresistance) and HTSC (high temperature super conductivity) such as $Pr_{1-x}Ca_xMnO_3$ (0<x<1, hereinafter, abbreviated as "PCMO"), the resistance value changes.

As a concrete characteristic, FIG. 13, in which the vertical axis indicates the resistance value and the horizontal axis indicates the number of pulse application times, shows a change in the resistance value when a pulse of 100 nanoseconds of ±5 V is applied to the PCMO having a thickness of 100 nm. By application of pulses, the resistance value changes between 1 kΩ and 1 MΩ and a large change of three digits in the resistance value occurs reversibly 100 times or more. FIG. 14, in which the vertical axis indicates the resistance value and the horizontal axis indicates the number of application times of a pulse of 4 V and 5 nanoseconds, shows that the resistance value of the variable resistive element changes in an analog manner in accordance with the number of pulse application times. Not only two states of a low resistance state (for example, 1 kΩ or less) and a high resistance state (100 kΩ or more) but also an arbitrary resistance state can be set. Consequently, for example, by dividing the resistance value into four states as shown in FIG. 17 between 10 kΩ and 1 MΩ, the resistance value can take multiple values and the bit cost can be reduced. It is expected that, by using such a variable resistance element for a memory carrier, an ideal high-speed, large-capacity nonvolatile semiconductor memory can be realized.

However, according to Hsu, S. T. et al., "Charge Transport Property in Non-Volatile Resistor Random Access Memory (RRAM)", Non-Volatile Semiconductor Memory Workshop 2003, pp. 97–98, February, 2003, as shown in FIGS. 15 and 16, the electric conductivity characteristic of the variable resistive element is almost linear when a current (I)-voltage (V) characteristic in each of the high resistance state and the low resistance state is plotted in a graph having the vertical axis of logarithm (LogI) of current and the horizontal axis of the square root ($\sqrt{V}$) of voltage. From the result, it can be said that the electric conductivity in each of the high and low resistance states displays nonlinear electric conductivity of the Poole-Frenkele type.

As the Poole-Frenkele type electric conductivity in the variable resistive element, the relation between the current value I and the voltage V is expressed by $I \propto Exp(\sqrt{V})$. It indicates that the current-voltage characteristic has very high nonlinearity and a small voltage change causes a large change in the current amount. Consequently, if there are variations in a program threshold voltage which changes from the low resistance state (hereinafter, described as RL) of a variable resistive element to the high resistance state (hereinafter, described as RH) or an erase threshold voltage which changes from the RH to the RL, when the same voltage is applied to the variable resistive element to program or erase data, a very large variation occurs in the amount of current flowing in the variable resistive element, and current consumed in programming or erasing increases.

SUMMARY OF THE INVENTION

The present invention has been made in consideration of the problems and its object is to provide a nonvolatile semiconductor memory device and a control method thereof which can realize reliable programming and erasing of data to/from a memory cell while suppressing increase in current consumption at the time of programming or erasing and in which a memory cell includes a variable resistive element for storing information according to a change in electric resistance caused by application of a voltage.

In order to achieve the above object, the present invention provides a nonvolatile semiconductor memory device comprising at least: a memory array in which a plurality of memory cells are arranged in a row direction and a column direction, each of the memory cells being formed by connecting one end of a variable resistive element for storing information according to a change in electric resistance caused by an electric stress and a drain of a selection transistor to each other on a semiconductor substrate; a word line connected to gates of the selection transistors of the plurality of memory cells in the same row; a source line connected to sources of the selection transistors of the plurality of memory cells in the same row or the same column; a bit line connected to the other ends of the variable resistive elements of the plurality of memory cells in the same column; a control circuit for executing controls of programming, erasing and reading of information to/from the memory cell; a voltage switch circuit for switching among a program voltage, an erase voltage and a read voltage to be applied to the source line and the bit line; and a read circuit for reading information from the memory cell, and further comprising a pulse voltage applying circuit for applying a voltage pulse for programming or erasing to the word line connected to the memory cell in the state where the program voltage or erase voltage corresponding to the bit line and the source line is applied to the bit line and the source line connected to the memory cell to be programmed or erased in the memory array via the voltage switch circuit.

In order to achieve the above object, the present invention also provides a control method of a nonvolatile semiconductor memory device, wherein the nonvolatile semiconductor memory device comprises at least: a memory array in which a plurality of memory cells are arranged in a row direction and a column direction, each of the memory cells being formed by connecting one end of a variable resistive element for storing information according to a change in electric resistance caused by an electric stress and a drain of a selection transistor to each other on a semiconductor substrate; a word line connected to gates of the selection transistors of the plurality of memory cells in the same row; a source line connected to sources of the selection transistors of the plurality of memory cells in the same row or the same column; a bit line connected to the other ends of the variable resistive elements of the plurality of memory cells in the same column; a control circuit for executing controls of programming, erasing and reading of information to/from the memory cell; a voltage switch circuit for switching among a program voltage, an erase voltage and a read voltage to be applied to the source line and the bit line; and a read circuit for reading information from the memory cell, and in the state where the program voltage or erase voltage corresponding to the bit line and the source line is applied to the bit line and the source line connected to the memory cell to be programmed or erased in the memory array via the voltage switch circuit, a voltage pulse for programming or erasing is applied to the word line connected to the memory cell, and a programming or erasing operation is performed.

Preferably, in the nonvolatile semiconductor memory device and the control method thereof according to the present invention, in the case of applying a voltage pulse for programming or erasing to the word line, a voltage pulse of a voltage value adjusted for programming is generated at the time of programming, and a voltage pulse of a voltage value adjusted for erasing is generated at the time of erasing.

More preferably, in the nonvolatile semiconductor memory device and the control method thereof according to the present invention, when the voltage pulse is applied to the gate of the selection transistor in the memory cell to be programmed or erased, a voltage value obtained by subtracting a drain-source voltage of the selection transistor from an absolute value of a voltage difference between the program voltage or the erase voltage applied to the bit line and the source line is set to be larger than either a program threshold voltage necessary for programming data to the variable resistive element or an erase threshold voltage necessary for erasing data in the variable resistive element.

More preferably, in the nonvolatile semiconductor memory device and the control method thereof according to the present invention, the voltage value of the voltage pulse is set so that the selection transistor operates in a saturation region at least in a period in the application period of the voltage pulse when the voltage pulse is applied to the gate of the selection transistor of the memory cell to be programmed or erased.

In the nonvolatile semiconductor memory device and the control method thereof according to the present invention, the program voltage or the erase voltage to be applied to the bit line and the source line is applied to the bit line or the source line and the word line, and the voltage pulse to be applied to the word line is applied to the source line or the bit line to which the program voltage or the erase voltage is not applied. In such a manner, at the time of programming or erasing, by interchanging the relation between the bit line and the word line or the relation between the source line and the word line, effects similar to those of the nonvolatile semiconductor memory device and the control method thereof according to the present invention can be exhibited.

DETAILED DESCRIPTION OF THE INVENTION

Embodiments of a nonvolatile semiconductor memory device according to the present invention and a control method thereof (hereinafter, appropriately referred to as "the inventive device" and "the inventive method") will be described with reference to the drawings.

First Embodiment

Figure 1:
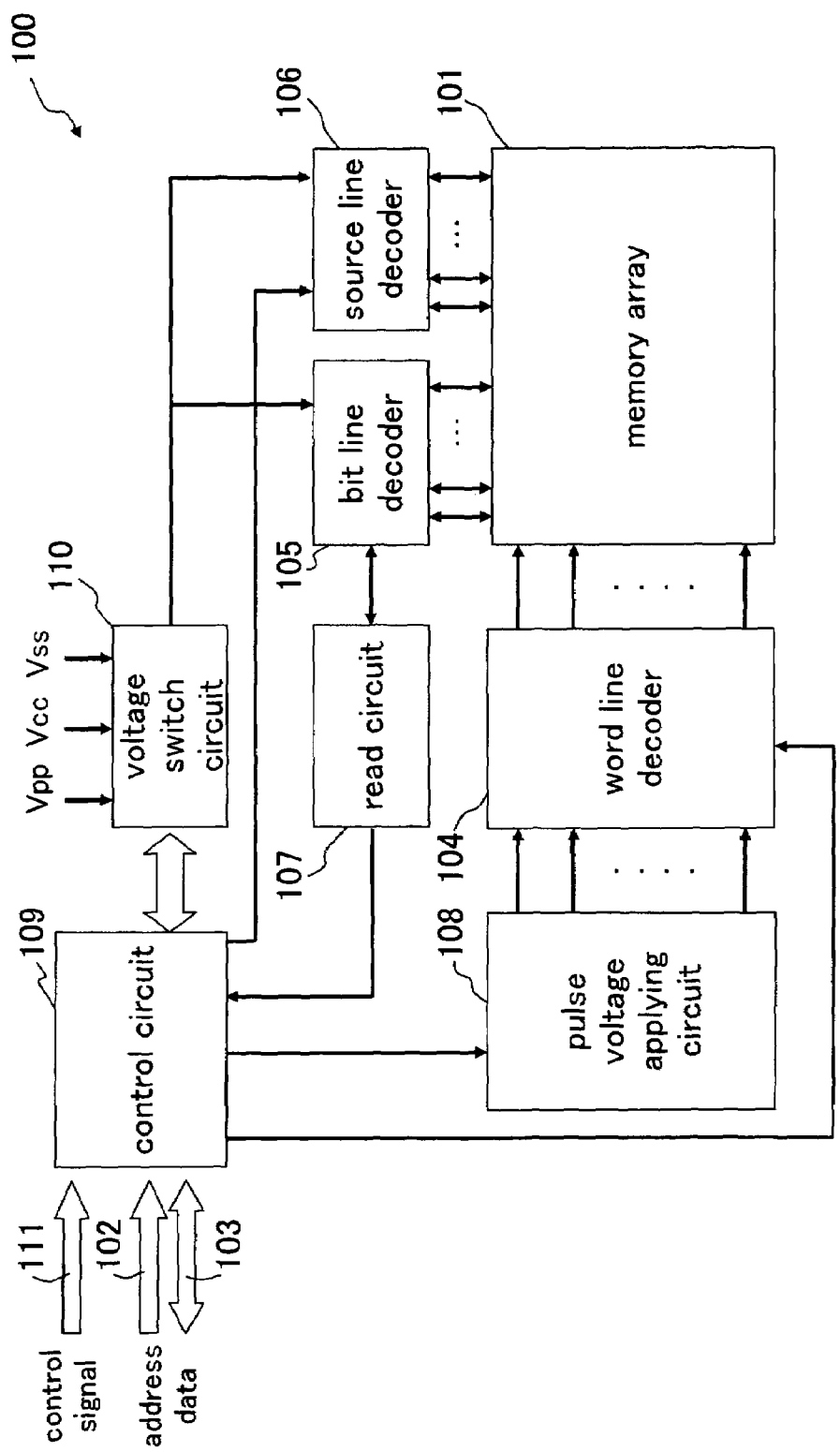
FIG. 1 is a block diagram showing a general configuration in an embodiment of a nonvolatile semiconductor memory device according to the present invention.

FIG. 1 is a block diagram of an inventive device 100. The inventive device 100 has a configuration in that information is stored in a memory array 101 and the memory array 101 is constructed by arranging a plurality of memory cells. Information can be stored/read to/from a memory cell in the memory array 101.

Information is stored into a specific memory cell in the memory array 101 corresponding to an address input from an address line 102. The information passes through a data line 103 and is output to the outside of the device. A word line decoder 104 selects a word line in the memory array 101 corresponding to a signal input to the address line 102, a bit line decoder 105 selects a bit line in the memory array 101 corresponding to an address signal input to the address line 102 and, further, a source line decoder 106 selects a source line of the memory array 101 corresponding to the address signal input to the address line 102. A control circuit 109 controls programming, erasing and reading of the memory array 101. The control circuit 109 controls the word line decoder 104, the bit line decoder 105, the source line decoder 106, a voltage switch circuit 110 and a pulse voltage applying circuit 108 on the basis of an address signal input from the address line 102, data input (at the time of programming) input from the data line 103 and a control input signal input from a control signal line 111, and controls reading, programming and erasing operations of the memory array 101. In the example shown in FIG. 1, the control circuit 109 has, although not shown, functions of an address buffer circuit, a data input/output buffer circuit and a control input buffer circuit as general circuits.

The voltage switch circuit 110 applies a bit line voltage and a source line voltage which are necessary at the time of reading, programming and erasing of the memory array 101. Vcc denotes a voltage supplied to the device, Vss denotes a ground voltage, and Vpp denotes a voltage for programming or erasing. The pulse voltage applying circuit 108 applies a pulse voltage to a word line selected by the word line decoder 104. The pulse voltage applying circuit 108 further has the function capable of simultaneously applying the same pulse voltage to one or more word lines and has the function capable of simultaneously applying a pulse voltage at different voltage levels to two or more word lines. Data is read from the memory array 101 via the bit line decoder 105 and a read circuit 107. The read circuit 107 determines the state of data, sends the result to the control circuit 109, and outputs it to the data line 103.

Figure 2:
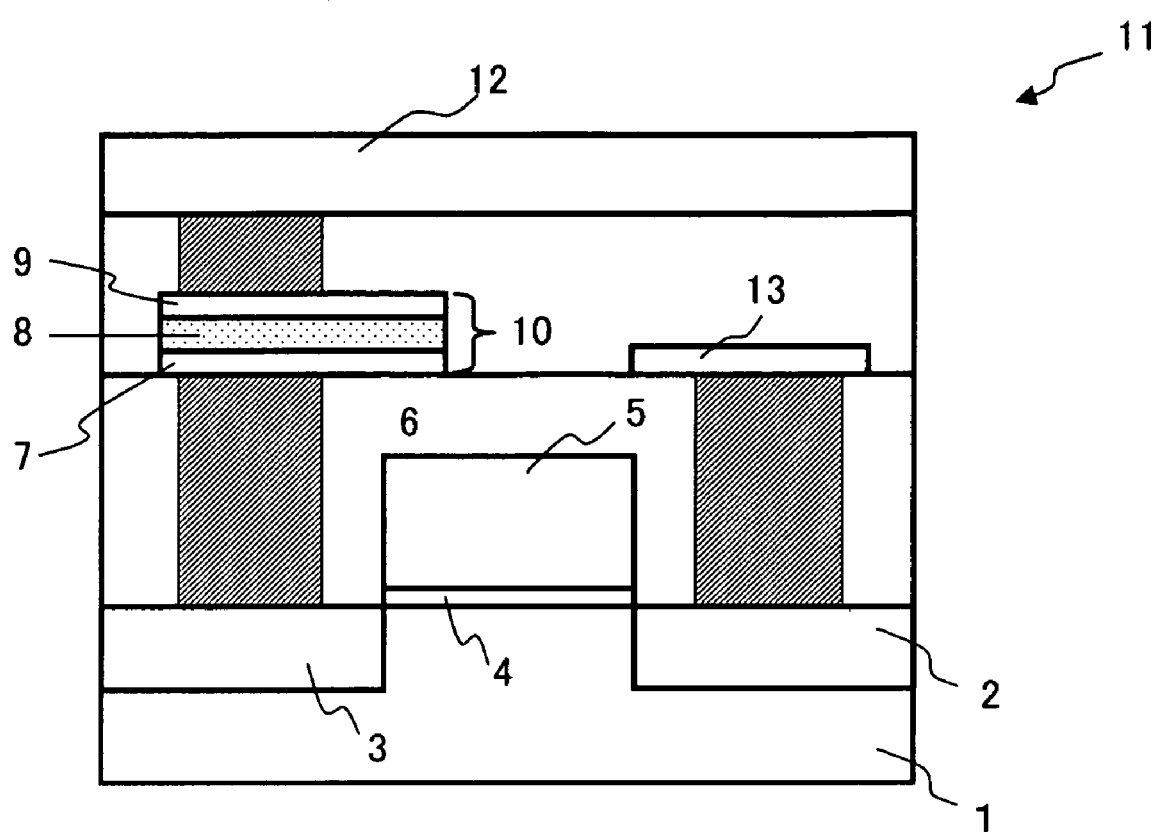
FIG. 2 is a cross-sectional view schematically showing the structure of a memory cell used in the nonvolatile semiconductor memory device according to the present invention.

FIG. 2 is a schematic cross-sectional view of a memory cell 11 as a component of the memory array 101. As shown in FIG. 2, the memory cell 11 is formed by connecting a selection transistor 6 and a variable resistive element 10 in series while electrically connecting a drain region 3 and a lower electrode 7. The selection transistor 6 is constructed by a source region 2 and the drain region 3 made in a semiconductor substrate 1 and a gate electrode 5 formed on a gate oxide film 4. The variable resistive element 10 is constructed by sandwiching a variable resistive material 8 of which resistance value changes when a voltage is applied between the lower electrode 7 and an upper electrode 9. The upper electrode 9 is connected to a metal wire 12 serving as a bit line, the gate electrode 5 is connected to a word line, and the source region 2 is connected to a diffusion layer or a metal wire 13 serving as a source line.

The variable resistive element 10 is a nonvolatile memory element of which electric resistance changes by application of a voltage and, even after the application of the voltage is finished, whose changed electric resistance is held, and which can store data according to the resistance change, and is a CMR (Colossal Magnetoresistance) memory element made of an oxide having a perovskite type crystal structure containing manganese. As the variable resistive material 8, for example, a film formed by using any of materials expressed as $Pr_{1-x}Ca_xMnO_3$, $La_{1-x}Ca_xMnO_3$ (PCMO), or $La_{1-x-y}Ca_xPb_yMnO_3$ (where x<1, y<1, x+y<1) is used. For example, a manganese oxide film made of $Pr_{0.7}Ca_{0.3}MnO_3$, $La_{0.65}Ca_{0.35}MnO_3$, $La_{0.65}Ca_{0.175}Pb_{0.175}MnO_3$ or the like is formed by MOCVD, spin coating, laser ablation, sputtering or the like.

Since the resistance change of the variable resistive element 10 is as large as three digits or more, even when a resistance value is divided into a plurality of regions and different information is defined for the regions, each of the information can be sufficiently determined. Consequently, the variable resistive element 10 can store multivalue information of one bit (binary data) or more. The above-listed variable resistive materials have a non-linear current-voltage characteristic. Concretely, they have the Poole-Frenkele type nonlinear electric conductivity characteristic described above.

Figure 3:
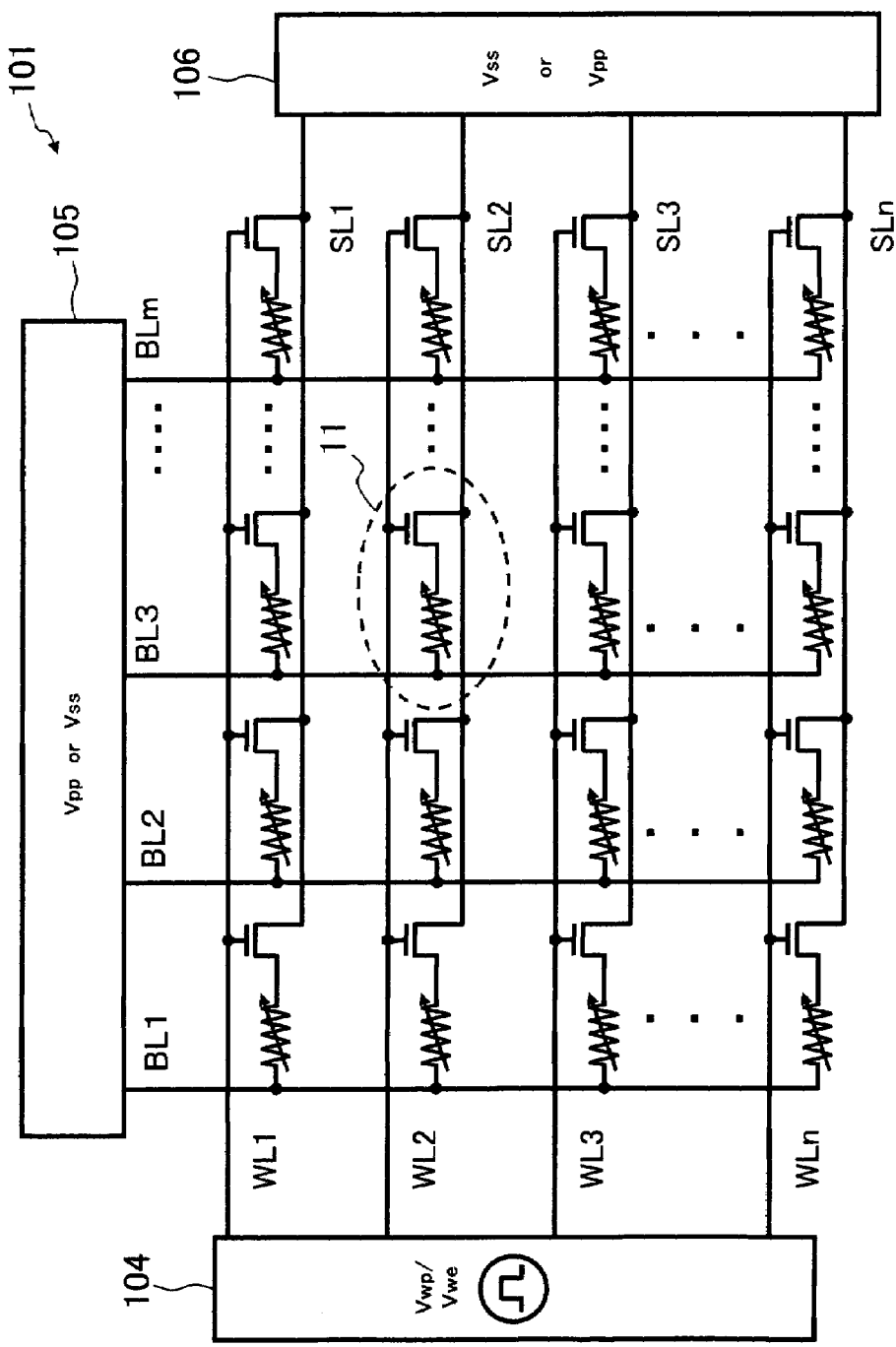
FIG. 3 is a circuit diagram showing an example of the configuration of a memory array used in the nonvolatile semiconductor memory device according to the present invention.
Figure 4:
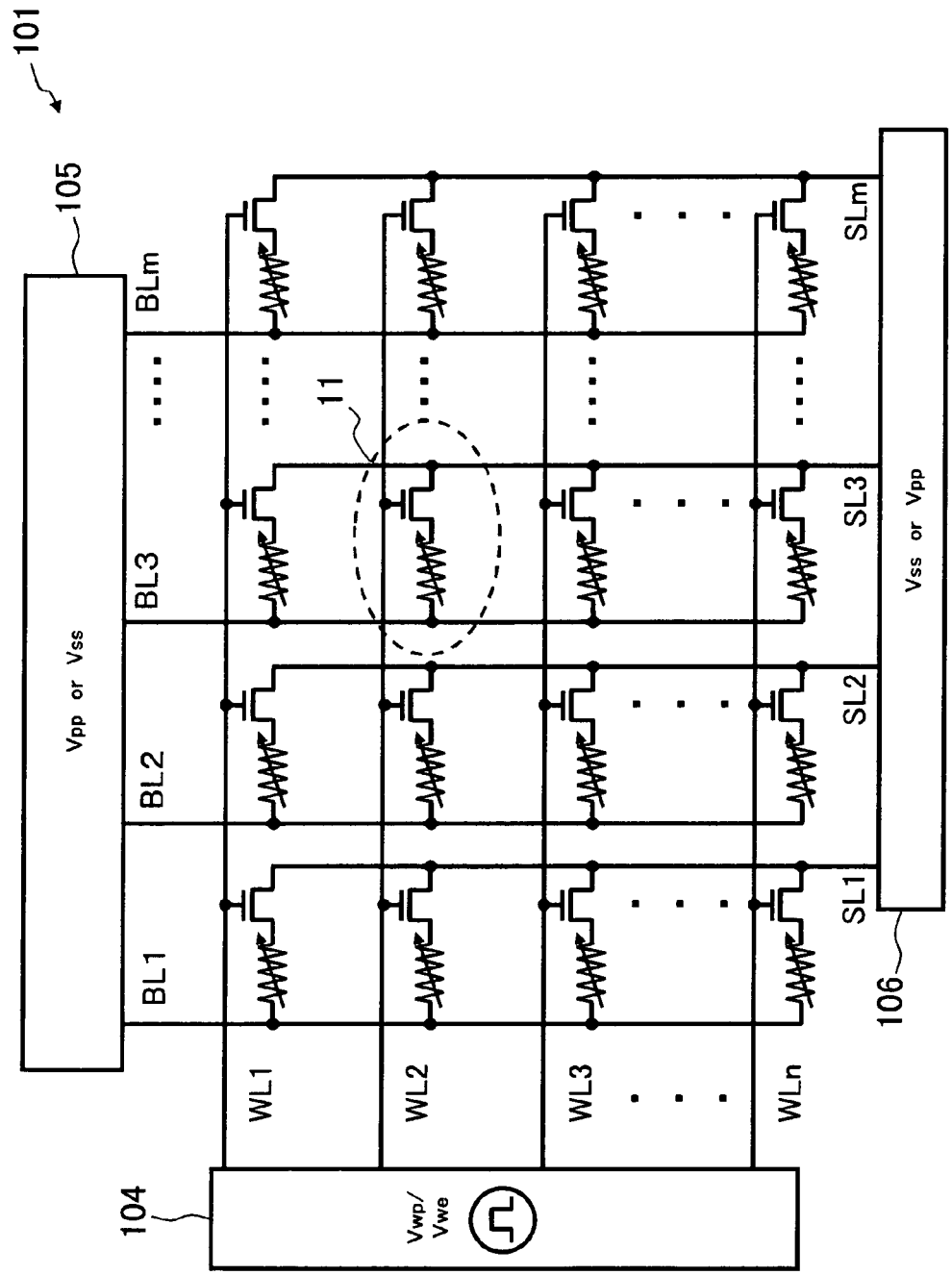
FIG. 4 is a circuit diagram showing another example of the configuration of the memory array used in the nonvolatile semiconductor memory device according to the present invention.
Figure 5:
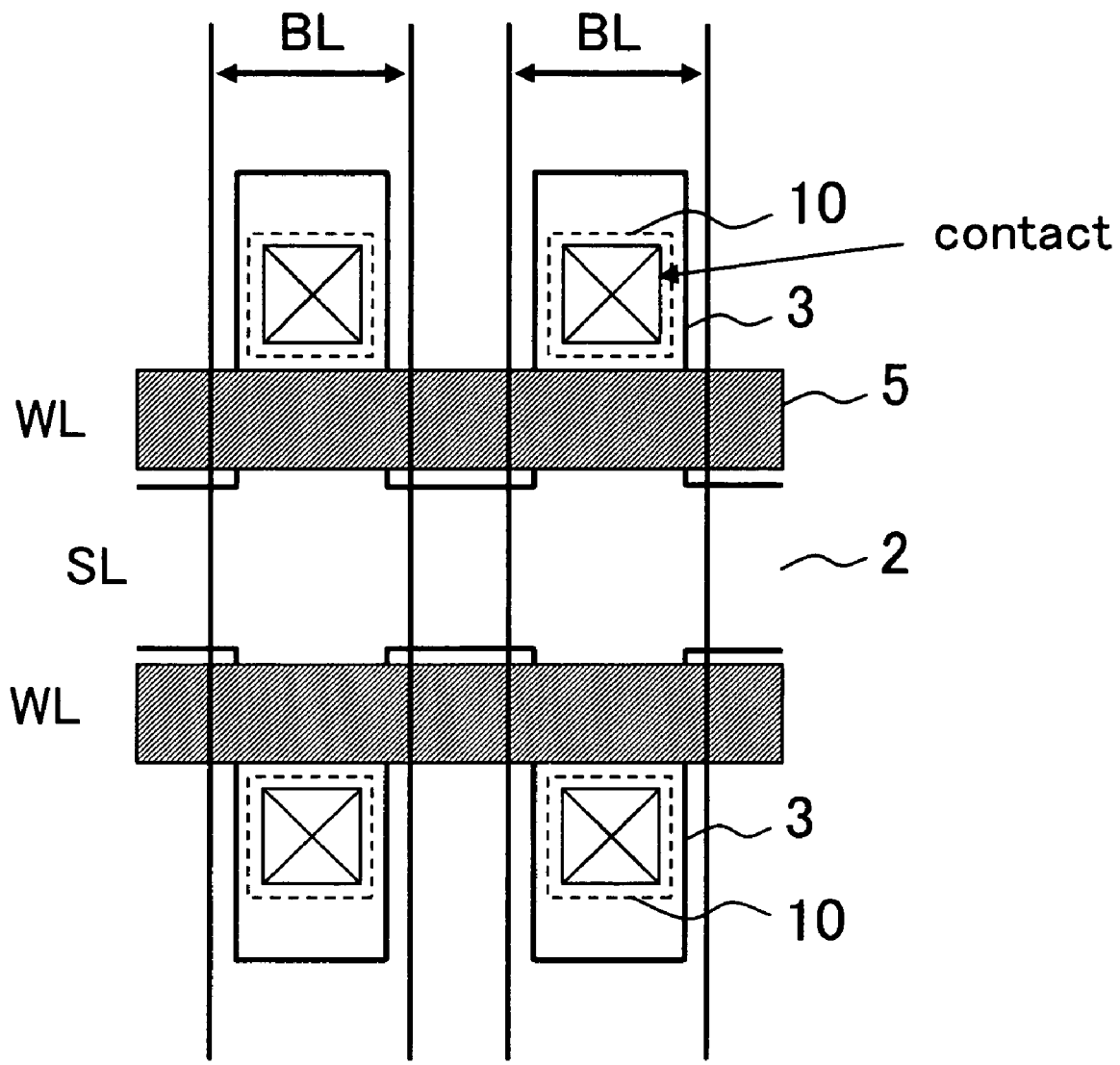
FIG. 5 is a schematic diagram showing the layout of a main portion of the memory array shown in FIG. 3.
Figure 6:
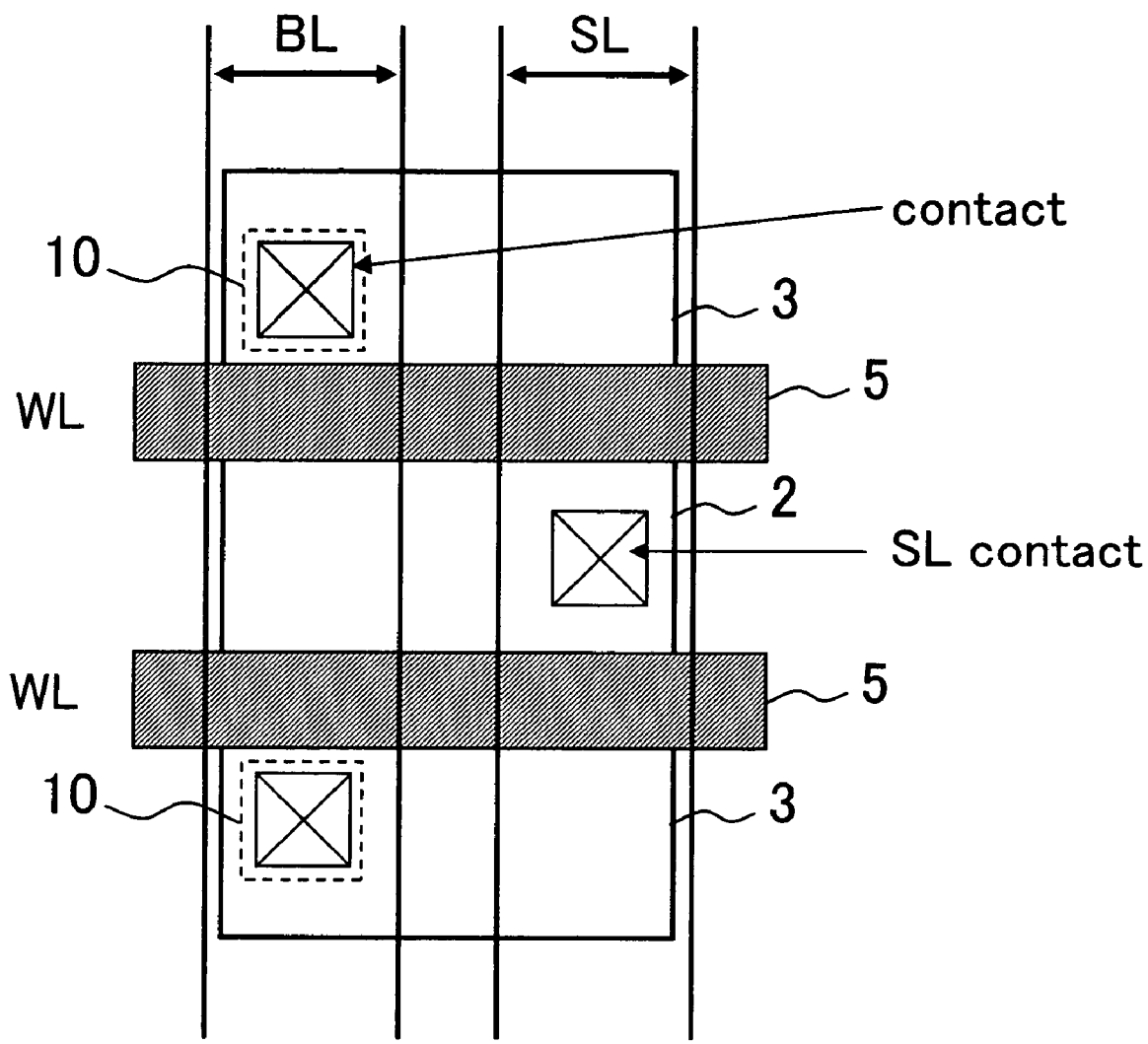
FIG. 6 is a schematic diagram showing the layout of a main portion of the memory array shown in FIG. 4.

FIGS. 3 and 4 schematically show the configurations of the memory array 101. In both of the configurations, the memory array 101 has a configuration in that m×n memory cells 11 are disposed at intersecting points of m bit lines (BL1 to BLm) and n word lines (WL1 to WLn). FIG. 3 shows a configuration in that n source lines (SL1 to SLn) are disposed in parallel with the word lines. FIG. 4 shows a configuration in that m source lines (SL1 to SLm) are disposed in parallel with bit lines. FIG. 5 is a schematic view showing the layout of a part (four cells) of the memory array 101 in which the source lines are parallel with the word lines as shown in FIG. 3. FIG. 6 is a schematic view showing the layout of a part (two cells) of the memory array in which the source lines are parallel with the bit lines as shown in FIG. 4. The memory arrays 101 in FIGS. 5 and 6 have different numbers of cells, but have almost the same area. The sectional structure of the memory cell shown in FIG. 2 does not directly correspond to any of the layouts of FIGS. 5 and 6, but can be adapted to the layout of each of the memory cells of FIGS. 5 and 6 by changing arrangement of the bit lines or source lines on the basis of the sectional structure of the memory cell shown in FIG. 2.

In the case of manufacturing the memory cell 11 by using a general MOS integrated circuit manufacturing method, in the memory array (FIG. 5) in which the source lines SL are parallel with the word lines WL, the source line SL can be formed by a diffusion layer. On the other hand, in the memory array (FIG. 6) in which the source lines SL are parallel with the bit lines BL, the source line SL cannot be formed by the diffusion layer. It is necessary to provide a contact in a source diffusion region and connect the contact to the source line SL of a metal layer every two cells. Since the source line SL has to be formed between the bit lines BL, the cell area enlarges.

In the memory array (FIG. 6) in which the source lines SL and the bit lines BL are parallel with each other, however, at the time of programming and erasing, it is sufficient to apply the program or erase voltage Vpp to one of the bit line BL and the source line SL of a selected cell, apply the ground voltage Vss to the other line, and apply a pulse voltage which will be described later to the word line. Consequently, the same control method can be used at the time of programming and erasing, and there is an advantage in that peripheral circuits for programming and erasing can be commonly used.

In the case of using the memory array of FIG. 3 and applying Vpp to the source line of a selected cell to perform erasing operation, the selection transistors 6 in not-selected cells in the same row and using a common word line are turned on and Vpp is applied to the source regions 2. Consequently, it becomes necessary to apply Vpp to all of bit lines of not-selected cells to prevent a voltage from being applied to the variable resistive elements 10, and the control becomes complicated. Any of the configurations of the memory array may be used, but it is preferable to use the array of FIG. 3 having a small cell area from the viewpoint of manufacturing cost. The present invention is not limited to the extending direction of the source lines, and the configurations of the memory array are not limited to the configurations shown in FIGS. 3 and 4, but a configuration obtained by modifying the two configurations may be also used.

The control method of the inventive device 100 will now be described. Table 1 shows voltage conditions at terminals at the time of programming and erasing of the memory cell 11. At the time of programming, when Vpp is applied to the upper electrode, Vss is applied to the source region, and a voltage pulse having a voltage amplitude Vwp which will be described later is applied to the gate electrode and the selection transistor 6 is turned on, a positive voltage which is equal to or more than a program threshold voltage switching voltage which changes from the low resistance state to the high resistance state is applied to the variable resistive element 10, and the low resistance state changes to the high resistance state (the voltage polarity in the case where the upper electrode has a voltage higher than that of the lower electrode is set to be positive). At the time of erasing, different from the programming operation, when Vss is applied to the upper electrode, Vpp is applied to the source region, a voltage pulse having voltage amplitude Vwe is applied to the gate electrode, and the selection transistor 6 is turned on, a negative voltage whose absolute value is equal to or more than the erase threshold voltage is applied to the variable resistive element 10 and the variable resistive element 10 changes from the high resistance state to the low resistance state.

TABLE 1

|  | Gate electrode | Upper electrode | Source region |
|---|---|---|---|
| Program | Vwp | Vpp | Vss |
| Erase | Vwe | Vss | Vpp |

The control method of the inventive device 100 will be described by also using an equivalent circuit of the memory cell 11 shown in FIG. 7. The selection transistor 6 and the variable resistive element 10 are connected in series, and the source region 2 in the selection transistor 6 and the upper electrode 9 of the variable resistive element 10 are connected to the voltage switch circuit 110 in FIG. 2, respectively. At the time of programming or erasing, Vpp (program or erase voltage) or Vss (ground voltage) is selectively applied. The pulse voltage applying circuit 108 is connected to the gate electrode 5 of the selection transistor 6, and a pulse voltage having a pulse width of "t" seconds and a voltage amplitude of Vwp or Vwe can be applied to the gate electrode 5.

Figure 8:
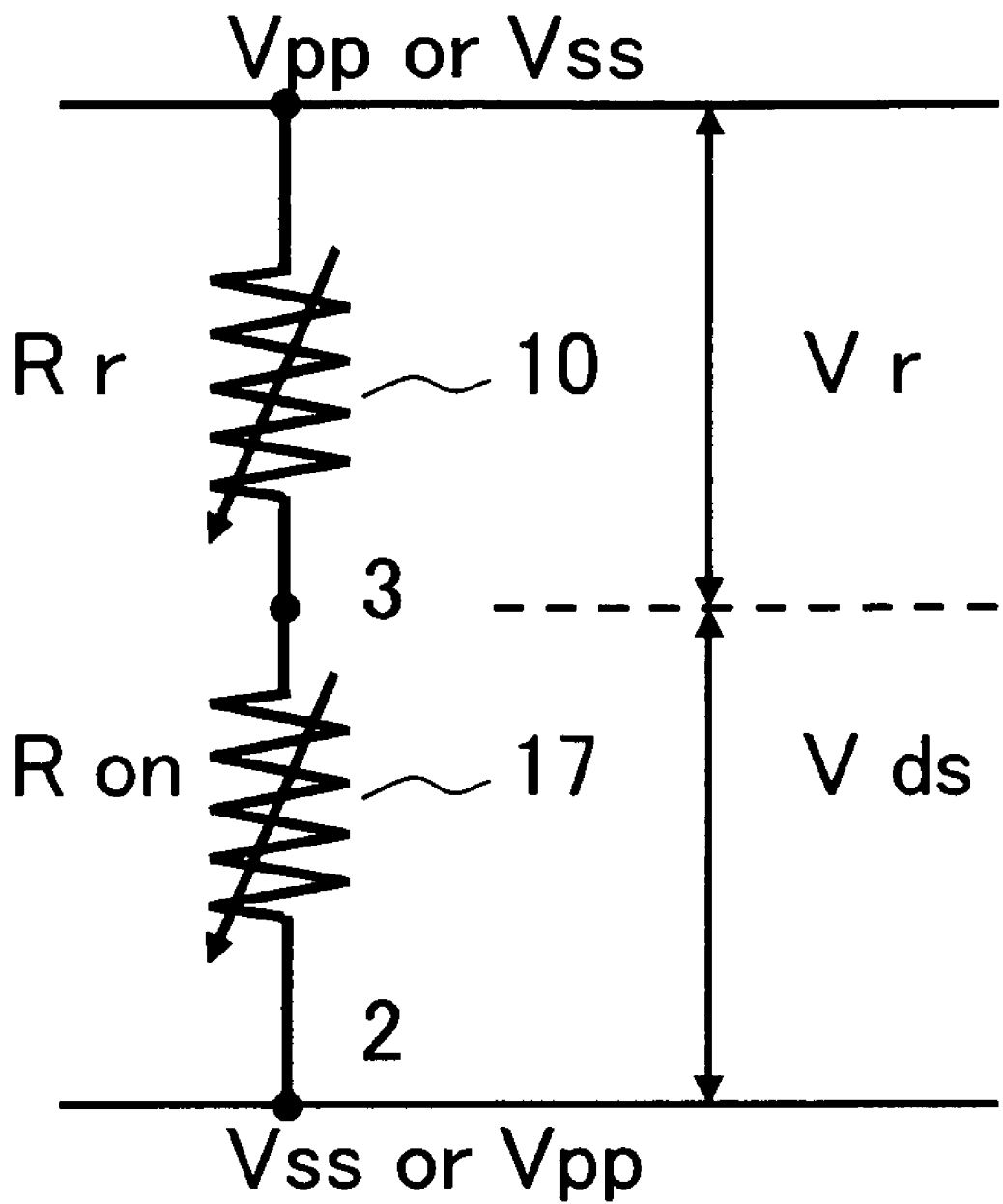
FIG. 8 is an equivalent circuit diagram for explaining a programming/erasing operation of a memory cell used in the nonvolatile semiconductor memory device according to the present invention.

In the state where the selection transistor 6 is on, the selection transistor 6 can be equivalently used as a resistive element 17 having an ON-state resistance value Ron and can be expressed as an equivalent circuit shown in FIG. 8. In FIG. 8, the resistance value of the variable resistive element 10 is expressed as Rr, and voltages to the resistive element 17 as the selection transistor 6 are described as Vds and Vr.

When the selection transistor 6 operates in a saturation region, the drain current does not show a large change in response to a change in the source-drain voltage Vds and the resistive element 17 can be dealt approximately as a constant current element. When the selection transistor 6 operates in a linear region (non-saturation region), the drain current changes so as to follow a change in the source-drain voltage.

To program data into the memory cell 11, first, the program voltage Vpp is applied to the upper electrode 9, and the ground voltage Vss is applied to the source region 2. When Vpp is applied to the upper electrode 9, the voltage Vr applied to the resistive element 17 is expressed by Mathematical Expression (1), the voltage Vds applied across the drain and source of the selection transistor 6 is expressed by Mathematical Expression (2), and the voltage different (Vpp−Vss) between the upper electrode 9 and the source region 2 is divided into Vr and Vds.

$$Vr = Vpp \times Rr/(Rr+Ron) \quad (1)$$

$$Vds = Vpp \times Ron/(Rr+Ron) \quad (2)$$

By adjusting the on-state resistance Ron in Mathematical Expressions (1) and (2) by the voltage amplitude Vwp of the pulse voltage applied to the gate electrode 5, the voltage Vr applied to the variable resistive element 10 can be controlled as shown by Mathematical Expression (1). Consequently, the voltage pulse having the voltage amplitude Vwp adjusted so that a voltage which is equal to or more than the program threshold voltage and is close to the program threshold voltage as much as possible is applied to the variable resistive element 10 is applied to the gate electrode 5. Vr denotes a voltage applied across the upper electrode 9 and the lower electrode 7 when the same current as the drain current flowing in the selection transistor 6 flows in the variable resistive element 10. If the voltage amplitude Vwp is increased unnecessarily and the on-state resistance Ron decreases excessively, a voltage exceeding the program threshold voltage is applied to the variable resistive element 10. Moreover, the drain current at the time of programming increases and, as a result, the current consumption at the time of programming increases.

Basically, the erasing operation of the memory cell 11 is the same as the programming operation. However, the resistance value of the variable resistive element 10 in the memory cell 11 in the erasing operation is in the high resistance state, so that the erase threshold voltage can be applied to the variable resistive element 10 with a drain current smaller than that in the programming operation. Consequently, the on-state resistance Ron of the selection transistor 6 can be set to be higher than that in the programming operation, and the voltage amplitude Vwe of the pulse voltage applied to the gate electrode 5 has to be set to be smaller than the voltage amplitude Vwp in the programming operation.

Figure 9:
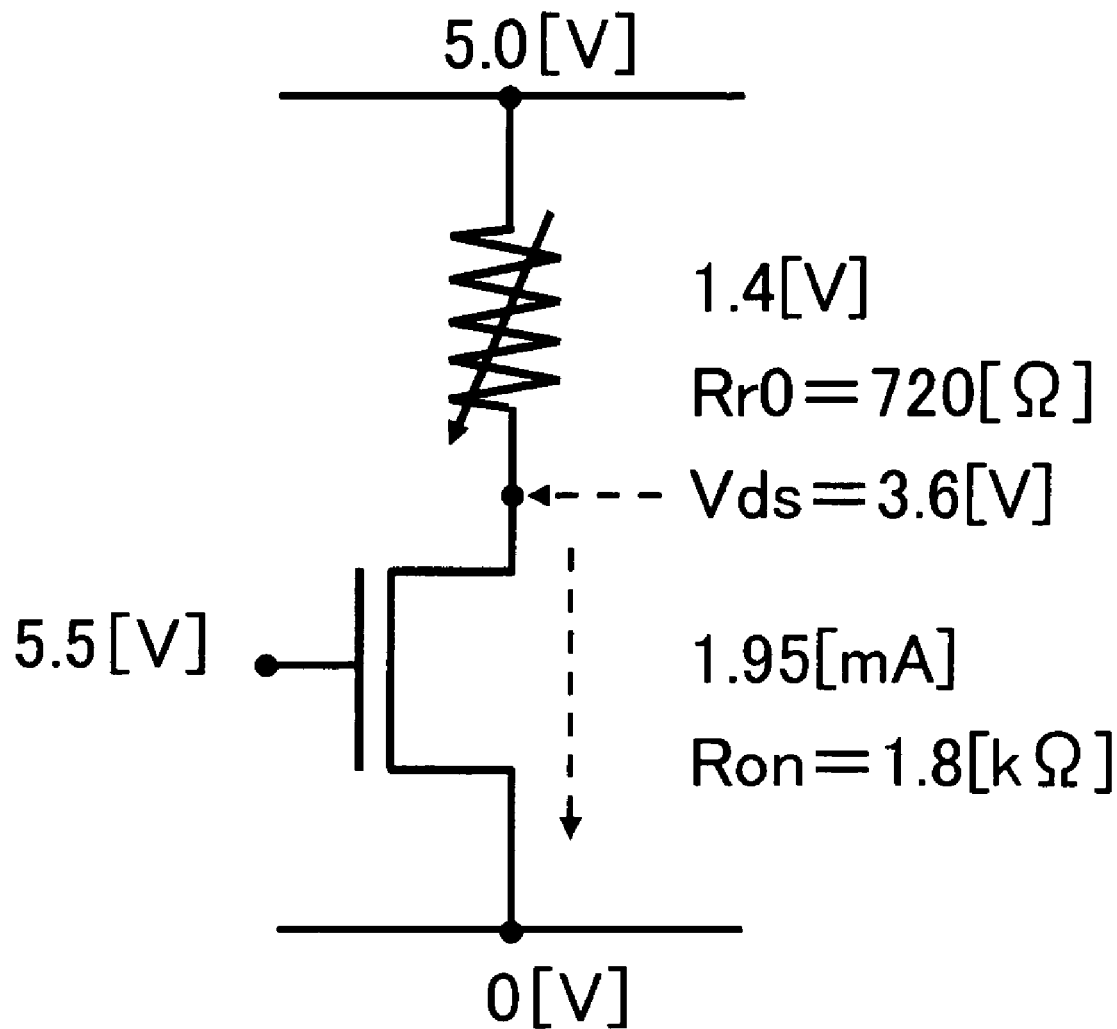
FIG. 9 is an equivalent circuit diagram for concretely explaining the programming operation of the memory cell used in the nonvolatile semiconductor memory device according to the present invention.

Adjustment of each of the voltage amplitude Vwp in the programming operation and the voltage amplitude Vwe in the erasing operation of the pulse voltage to be applied to the gate electrode 5 in the selection transistor 6 will be concretely described with reference to FIGS. 9 to 12. FIG. 9 shows the voltages Vpp, Vss and Vwp applied to the terminals of the memory cell 11 in FIG. 7 in the programming operation, the drain-source voltage Vds, drain current and on-state resistance Ron of the selection transistor 6, and resistance Rr0 and a voltage Vr0 across terminals in the low resistance state of the variable resistive element 10. As a sample example used for a program/erase test of the memory cell 11, the voltages Vpp, Vss and Vwp are 5 V, 0 V and 5.5 V, respectively. Vds, the drain current and on-state resistance Ron of the selection transistor 6 are 3.6 V, 1.95 mA and 1.8 kΩ, respectively. The resistance Rr0 and the voltage Vr0 across the terminals of the variable resistive element 10 are 720 Ω and 1.4 V, respectively. In the sample example, when the voltage amplitude Vwp of the pulse voltage is 5.5 V, the voltage of 1.4 V exceeding the program threshold voltage is applied to the variable resistive element 10 and the resistance value changes from 720 Ω to the high resistance state.

Figure 10:
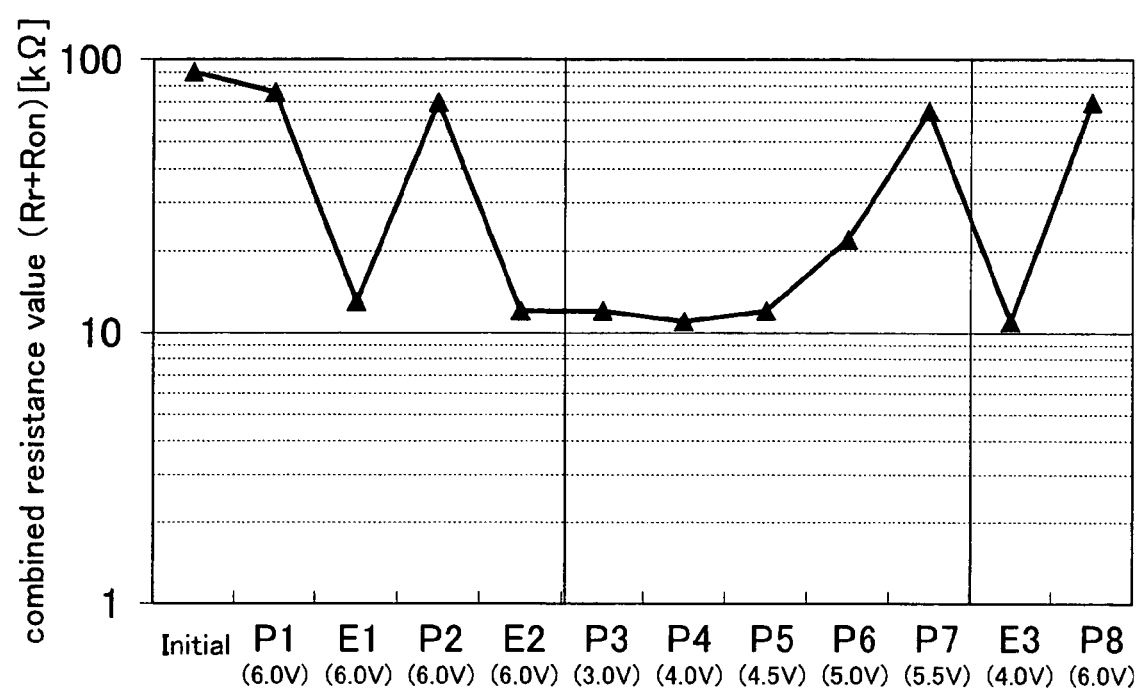
FIG. 10 is a diagram showing dependency on a gate voltage in the programming operation of a memory cell used in the nonvolatile semiconductor memory device according to the present invention.

FIG. 10 shows dependency of the voltage amplitude Vwp in the programming operation. The figure shows changes in a combined resistance value (Rr+Ron) of the memory cell 11 in the case where the programming/erasing operation is repeated from the left end to the right. A predetermined read voltage of 1 V or less is applied to a bit line, unnecessary programming and erasing operations are eliminated, and the combined resistance value is measured. In the figure, P1 to P8 denote the programming operations and E1 to E3 denote the erasing operations. Vpp and Vss in the programming and erasing operations are 5 V and 0 V, respectively, and the pulse width of the pulse voltage is 100 nanoseconds. The voltage values of the voltage amplitudes Vwp and Vwe of pulse voltages in the operations are shown in parentheses below P1 to P8 and E1 to E3. P1, E1, P2 and E2 show an operation check to see whether programming/erasing can be normally performed on the sample used for the program/erase test. In the program operations P3 to P7, the pulse voltage is applied while increasing the voltage amplitude Vwp step by step in increments of 0.5 V from 3.0 V to 5.5 V. As a result, programming with the voltage amplitude Vwp of 5.5 V could be checked. E3 and P8 denote an operation check made after the dependency of the voltage amplitude Vwp was examined. It is therefore understood that the voltage of 1.4 V exceeding the program threshold voltage is not applied to the variable resistive element 10 when the voltage amplitude Vwp is 5 V or less and the variable resistive element 10 does not change from the low resistance state (720 Ω) to the high resistance state. Since intermediate programming is recognized when the voltage amplitude Vwp is 5 V, by controlling the voltage amplitude Vwp with high precision, multi-value storage can be realized.

Figure 7:
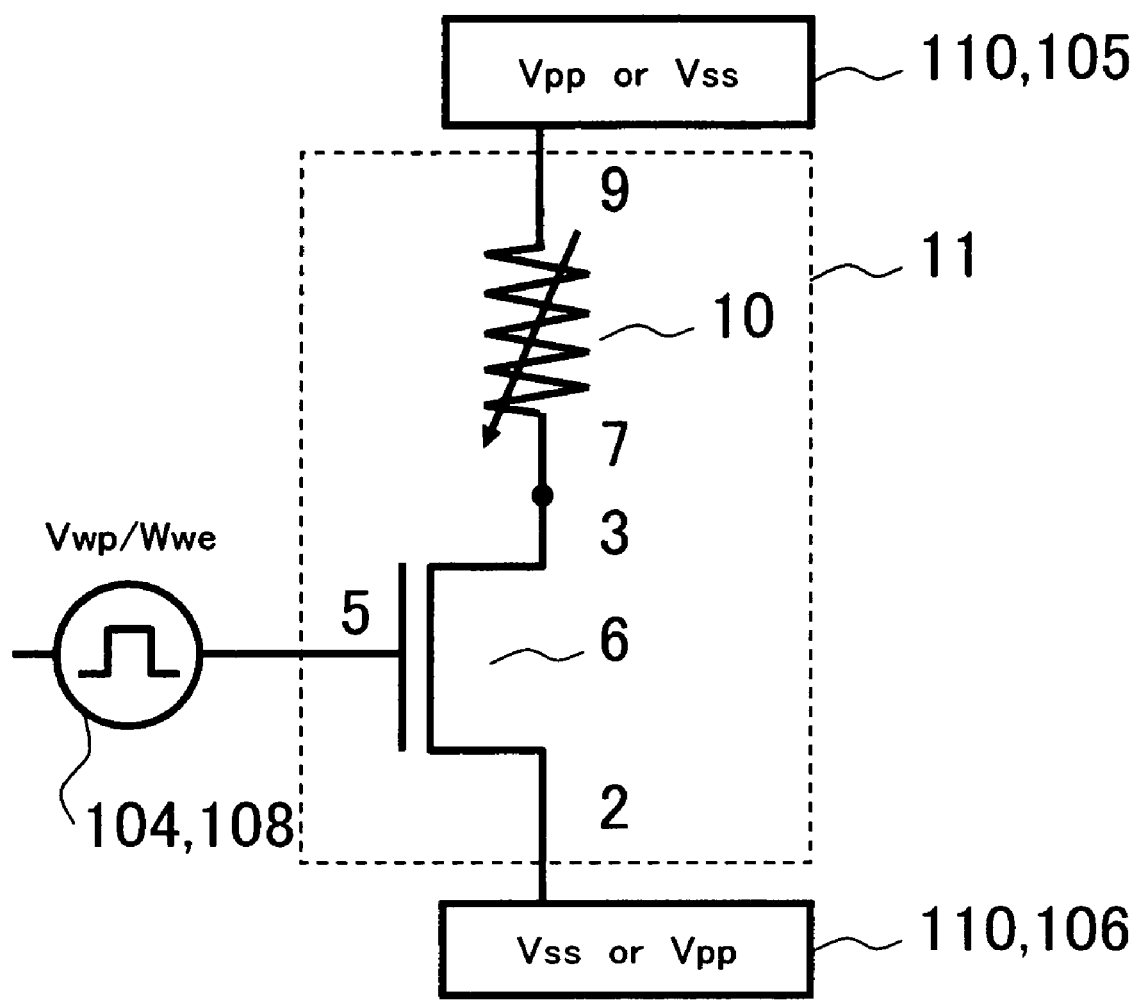
FIG. 7 is an equivalent circuit diagram for explaining a programming/erasing operation of a memory cell used in the nonvolatile semiconductor memory device according to the present invention.
Figure 11:
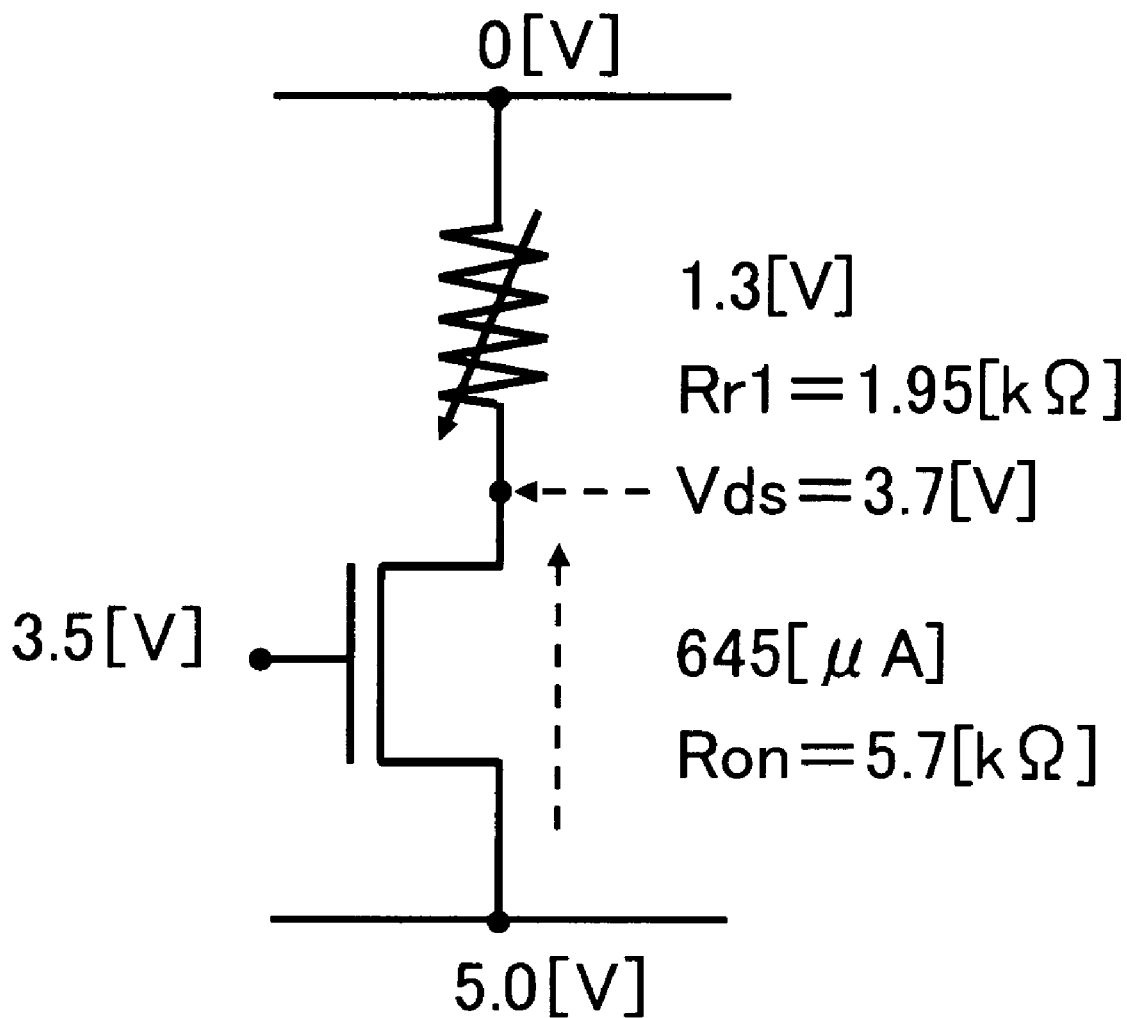
FIG. 11 is an equivalent circuit diagram for concretely explaining the erasing operation of the memory cell used in the nonvolatile semiconductor memory device according to the present invention.

FIG. 11 shows the voltages Vpp, Vss and Vwe applied to the terminals of the memory cell 11 in FIG. 7 in the erasing operation, the drain-source voltage Vds, drain current and on-state resistance Ron of the selection transistor 6, and resistance Rr1 and a voltage Vr1 across terminals in the high resistance state of the variable resistive element 10. As a sample example used for a program/erase test of the memory cell 11, the voltages Vpp, Vss and Vwe are 5 V, 0 V and 3.5 V, respectively. Vds, the drain current and on-state resistance Ron of the selection transistor 6 are 3.7 V, 645 μA, and 5.7 kΩ, respectively. The resistance Rr1 and the voltage Vr1 across the terminals (absolute value) of the variable resistive element 10 are 1.95 kΩ and 1.3 V, respectively. In the sample example, when the voltage amplitude Vwe of the pulse voltage is 3.5 V, the voltage of 1.4 V (absolute value) exceeding the erase threshold voltage is applied to the variable resistive element 10 and the resistance value changes from 1.95 kΩ to the low resistance state.

Figure 12:
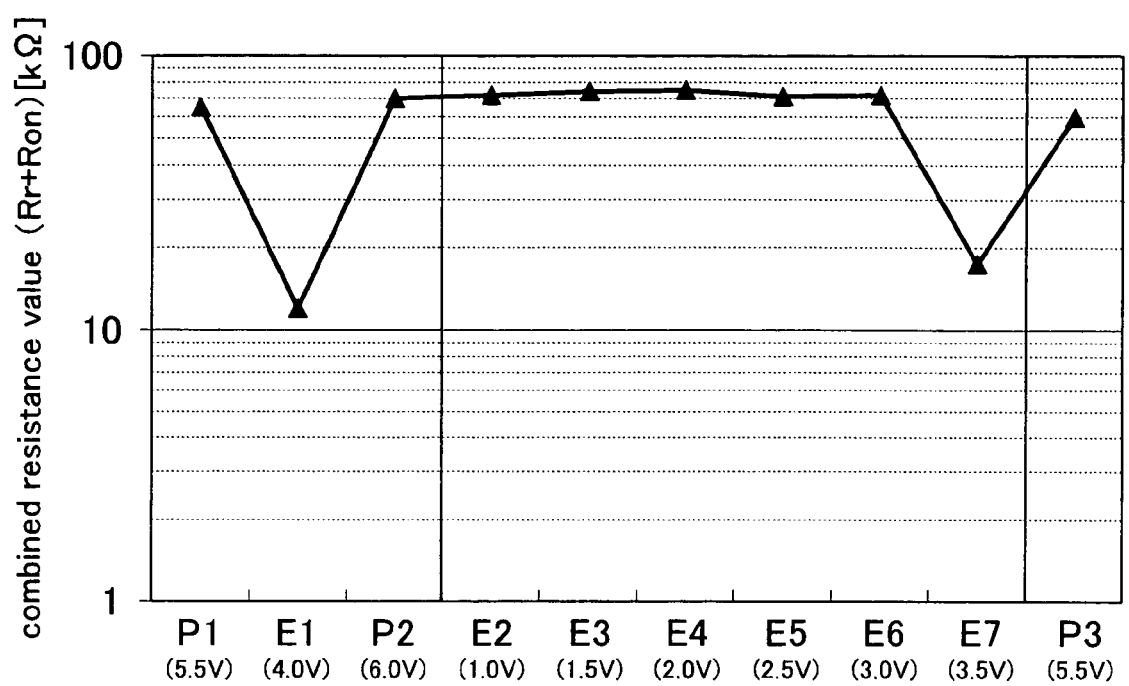
FIG. 12 is a diagram showing dependency on the gate voltage in the erasing operation of a memory cell used in the nonvolatile semiconductor memory device according to the present invention.
Figure 13:
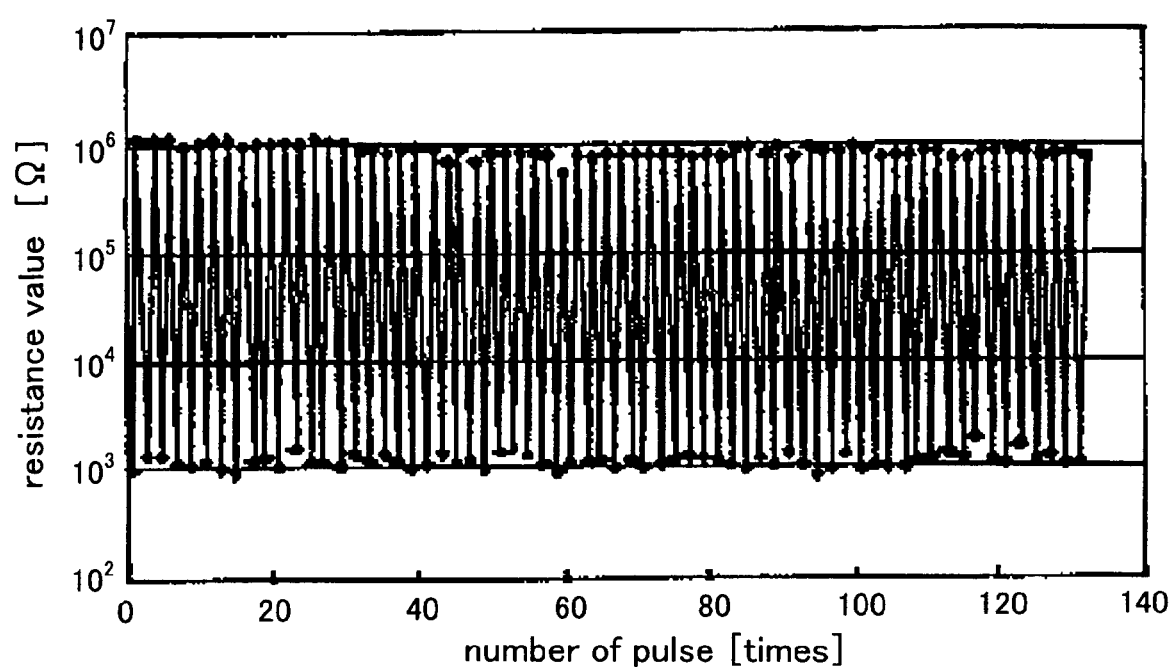
FIG. 13 is a characteristic diagram showing a switching characteristic of a variable resistive element.
Figure 14:
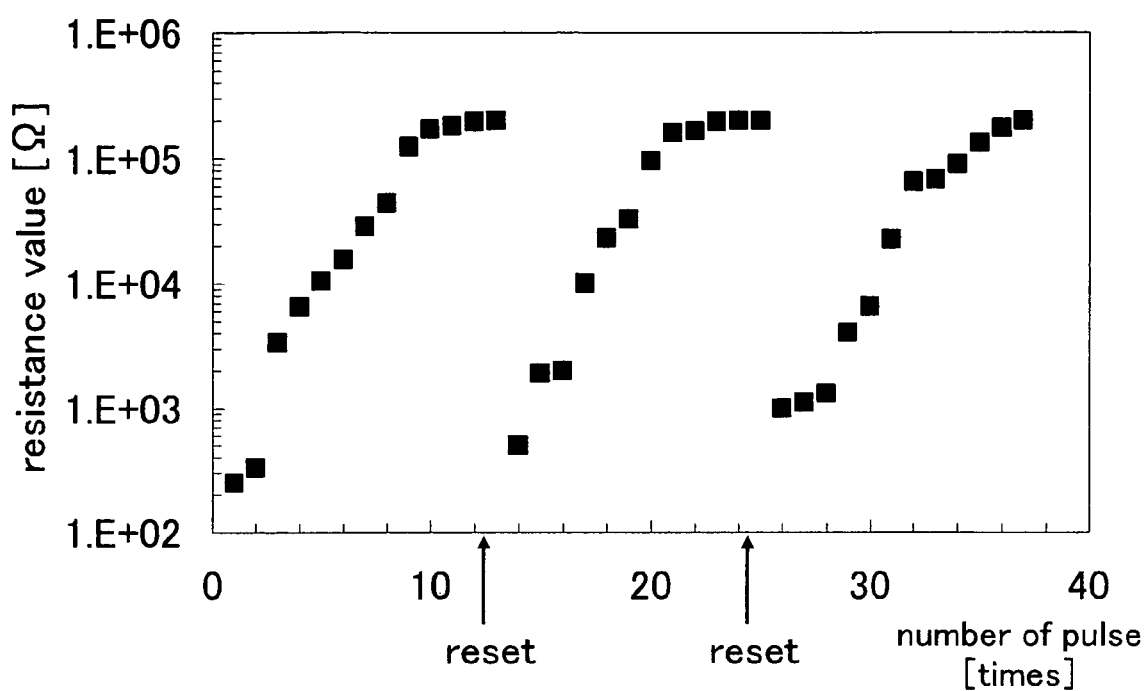
FIG. 14 is a characteristic diagram showing a switching characteristic of the variable resistive element.
Figure 15:
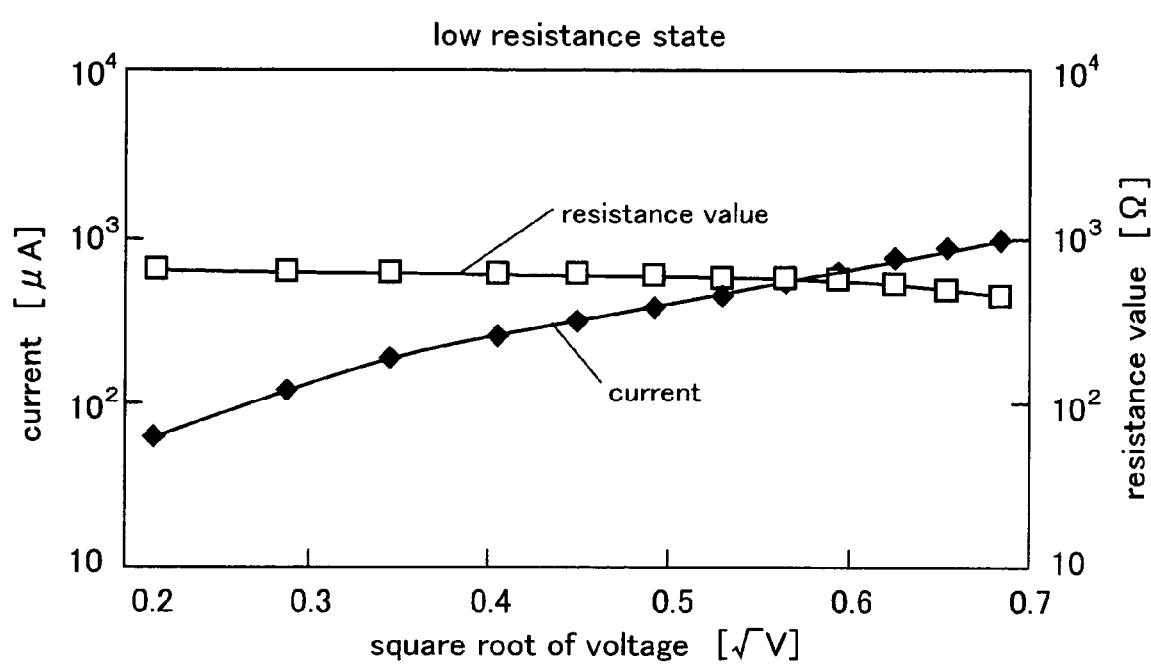
FIG. 15 is a characteristic diagram showing a nonlinear current-voltage characteristic in the low resistance state of the variable resistive element.
Figure 16:
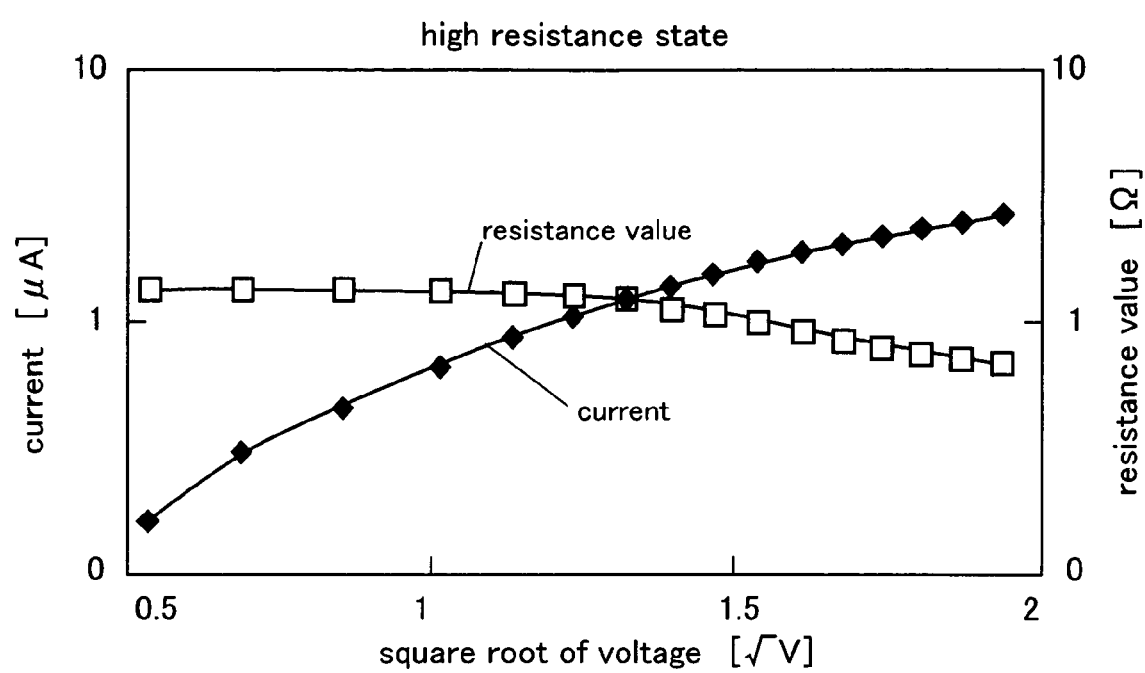
FIG. 16 is a characteristic diagram showing the nonlinear current-voltage characteristic in the high resistance state of the variable resistive element.
Figure 17:
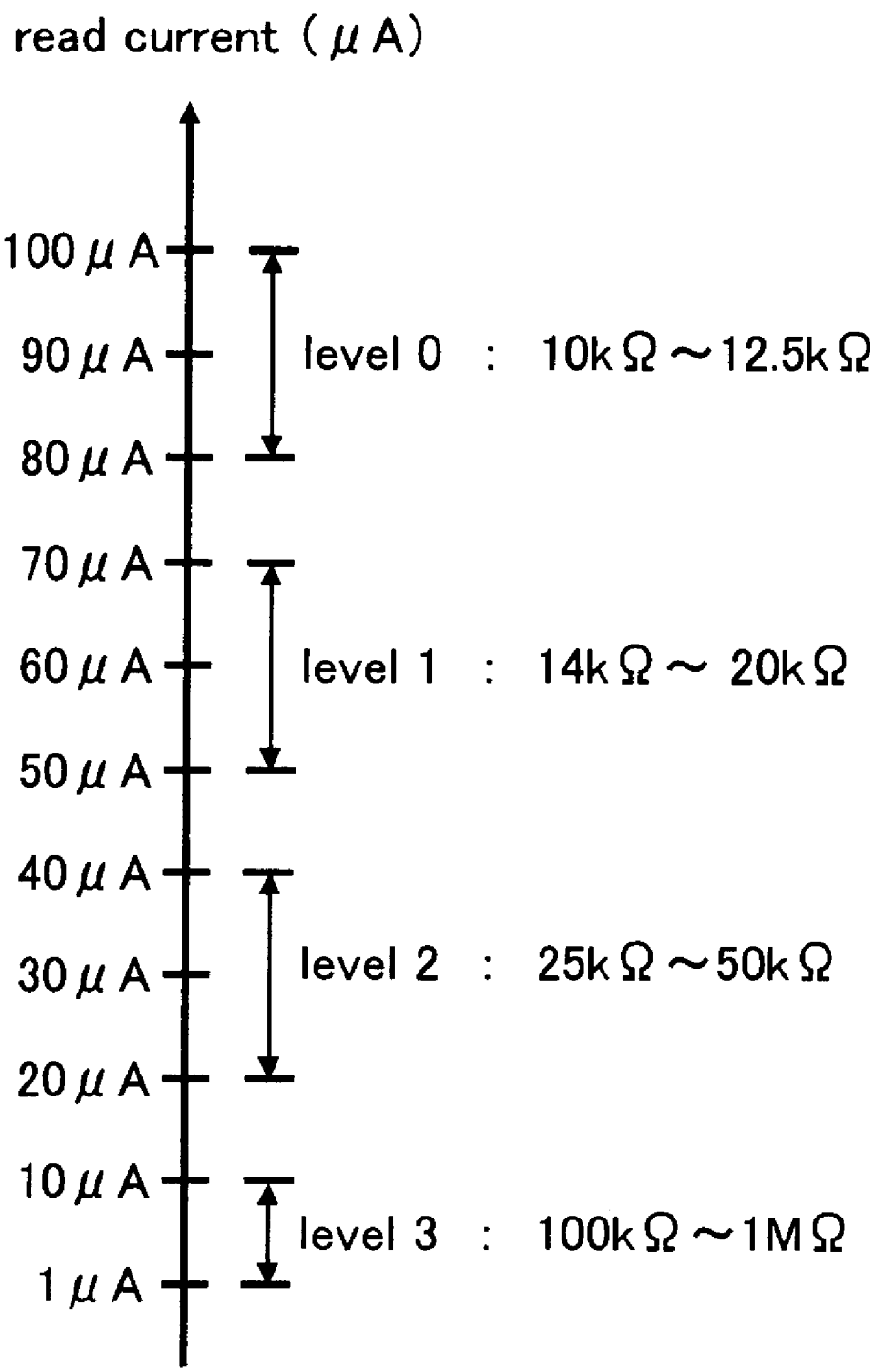
FIG. 17 is a diagram showing the range of multivalue levels in the case of applying the variable resistive element to a multivalue memory cell.

FIG. 12 shows dependency of the voltage amplitude Vwe in the erasing operation. The figure shows changes in a combined resistance value (Rr+Ron) of the memory cell 11 in the case where the programming/erasing operation is repeated from the left end to the right. A predetermined read voltage of 1 V or less is applied to a bit line, unnecessary programming and erasing operations are eliminated, and the combined resistance value is measured. In the figure, P1 to P3 denote the programming operations and E1 to E7 denote the erasing operations. Vpp and Vss in the programming and erasing operations are 5 V and 0 V, respectively, and the pulse width of the pulse voltage is 100 nanoseconds. The voltage values of the voltage amplitudes Vwp and Vwe of pulse voltages in the operations are shown in parentheses below P1 to P3 and E1 to E7. P1, E1 and P2 show an operation check to see whether programming/erasing can be normally performed on the sample used for the program/erase test. In the erasing operations E2 to E7, the pulse voltage is applied while increasing the voltage amplitude Vwe step by step in increments of 0.5 V from 1.0 V to 3.5 V. As a result, erasing with the voltage amplitude Vwe of 3.5 V could be checked. P3 denotes a program operation check made after the dependency of the voltage amplitude Vwe was examined. It is therefore understood that the voltage of 1.3 V (absolute value) exceeding the erase threshold voltage is not applied to the variable resistive element 10 when the voltage amplitude Vwe is 3 V or less, and the resistance value does not change from the high resistance state (1.95 kΩ) to the low resistance state.

Assuming now that the selection transistor 6 to which the pulse voltage is applied operates in the saturation region, the gate voltage becomes dominant. Even when the drain-source voltage Vds changes, an almost constant drain current flows, so that constant current programming is performed. The drain current is adjusted with the voltage amplitude Vwp or Vwe of the pulse voltage, and the voltage value of Vr applied to the variable resistive element 6 can be changed. On the other hand, when the selection transistor 6 operates in the non-saturation region, the drain-source voltage Vds becomes dominant, so that constant current programming is not performed. When the drain-source voltage Vds becomes large to a certain extent, the linearity deteriorates, and the drain current changes due to a change in the gate voltage. Consequently, by adjusting the drain current by the voltage amplitude Vwp or Vwe of the pulse voltage, the voltage value of Vr applied to the variable resistive element 10 can be changed.

Therefore, it can be said that the saturation region is desirable as the operation region when the pulse voltage is applied to the gate voltage 5 of the selection transistor 6. Particularly, at the time of erasing shown in FIG. 11, in association with the erasing operation, the resistance value of the variable resistive element 10 decreases and the drain current becomes higher as compared with that in the initial state. It is therefore preferable that increase in the current consumption can be suppressed by the constant current operation. Consequently, even if the selection transistor is not in the saturation region at the start of the erasing operation, as the resistance value of the variable resistive element 10 changes, the drain-source voltage Vds increases, the selection transistor 6 enters a saturation state, and the current consumption at the time of erasing can be suppressed by the constant current operation.

In a short-channel transistor having a gate length of L<1 $\mu$m, it is known that carrier speed is saturated in the non-linear region of a conventional long-channel transistor, called "early saturation" and a region in which a change in the drain current is smaller relative to that in the drain-source voltage Vds exists even in the non-linear region. It can be regarded that the saturation state substantially includes the early saturation region.

As the pulse width of the pulse voltage, in the sample examples of FIGS. 10 and 12, 100 nanoseconds is set. As the pulse width, an optimum value has to be employed according to the characteristics of the variable resistive element 10. When data of the above-described first document is referred to, for example, 100 nanoseconds is preferable and a value in the range from 10 nanoseconds to 100 $\mu$s may be appropriately selected. If the programming/erasing operation is completed with the pulse width of 100 $\mu$s or less, the time is sufficiently shorter than the program time of the flash memory under the present circumferences.

It has been described above that, in the inventive device and the inventive method, at the time of programming and erasing, by independently adjusting the voltage amplitudes Vwp and Vwe of the pulse voltage applied to the gate electrode 5 in the selection transistor 6 in the memory cell 11, the programming and erasing operations can be performed. Alternatively, another control method of using the same voltage amplitude of the pulse voltage at-the time of programming and erasing and adjusting the program or erase voltage Vpp to be applied to the bit line or source line so as to apply a proper voltage to the variable resistive element 10 in each of the programming and erasing operations can be also considered.

According to the another control method, however, in the case where the selection transistor 6 operates in the saturation region, even when Vpp is changed, the amount of current flowing in the variable resistive element 10 does not change largely, so that the voltage applied to the variable resistive element 10 does not change so much. In the programming or erasing method by controlling Vpp, there is the possibility in that programming or erasing is not performed due to variations in the program or erase threshold voltage in the variable resistive element 10.

Therefore, in the inventive method, since the drain current in the selection transistor 6 is changed by controlling the gate voltage of the selection transistor 6, a necessary voltage to be applied to the variable resistive element 10 can be properly controlled. Consequently, excessive current does not flow in the memory cell 11 and the voltage amplitudes Vwp and Vwe of the pulse voltage can be controlled so that the voltage which is equal to or more than the program/erase threshold voltage and is close to the program/erase threshold voltage as much as possible can be applied to the variable resistive element 10 with high precision.

The inventive method is particularly effective to a variable resistive element having a nonlinear current-voltage characteristic since the necessary voltage to be applied to the variable resistive element 10 can be controlled with high precision. Moreover, according to the inventive method, by changing the magnitude of the voltage amplitude Vwp of the pulse voltage at the time of programming, the voltage to be applied to the variable resistive element 10 can be adjusted with high precision. Consequently, the present invention provides the programming method particularly effective to a multivalue memory cell as a memory cell sensitive to variations in the resistance value and to which multivalue information of one or more bits is programmed.

Conditions of applying voltages to the bit line, source line and word line at the time of programming and erasing the memory array 101 in the inventive device 100 shown in FIG. 1 will now be described.

In the programming of the case where the memory array 101 has the memory array configuration shown in FIG. 3, the program voltage Vpp and the ground voltage Vss are applied to a selected bit line and a not-selected bit line, respectively, via the bit line decoder 105 and the voltage switch circuit 110, and the ground voltage Vss is applied to all of the source lines via the source line decoder 106 and the voltage switch circuit 110. After that, the pulse voltage having the voltage amplitude Vwp is applied to a selected word line from the pulse voltage applying circuit 108 via the word line decoder 104.

In the erasing of the case where the memory array 101 has the same memory array configuration shown in FIG. 3, first, the ground voltage Vss and the erase voltage Vpp are applied to a selected bit line and a not-selected bit line, respectively, via the bit line decoder 105 and the voltage switch circuit 110. The erase voltage Vpp and the ground voltage Vss are applied to a selected source line and a not-selected source line, respectively, by using the source line decoder 106 and the voltage switch circuit 110. After that, the pulse voltage having the voltage amplitude Vwe is applied from the pulse voltage applying circuit 108 to a selected word line via the word line decoder 104.

In the programming of the case where the memory array 101 has the memory array configuration shown in FIG. 4, the program voltage Vpp and the ground voltage Vss are applied to a selected bit line and a not-selected bit line, respectively, via the bit line decoder 105 and the voltage switch circuit 110, and the ground voltage Vss is applied to all of the source lines via the source line decoder 106 and the voltage switch 110. After that, the pulse voltage having the voltage amplitude Vwp is applied to a selected word line from the pulse voltage applying circuit 108 via the word line decoder 104.

In the erasing of the case where the memory array 101 has the same memory array configuration shown in FIG. 4, first, the ground voltage Vss is applied to all of bit lines via the bit line decoder 105 and the voltage switch circuit 110, and the erase voltage Vpp and the ground voltage Vss are applied to a selected source line and a not-selected source line, respectively, via the source line decoder 106 and the voltage switch circuit 110. After that, the pulse voltage having the voltage amplitude Vwe is applied from the pulse voltage applying circuit 108 to a selected word line via the word line decoder 104.

It has been described above that data can be programmed/erased to/from the memory array 10 1 of the inventive device with any of the two kinds of memory array configurations of the different source line arranging methods shown in FIGS. 3 and 4. The number of word lines to which the pulse voltage is applied may be one. The pulse voltage may be also applied simultaneously to two or more word lines in order to increase the program speed (program throughput) of the inventive device. When the number of word lines to which the pulse voltage is to be applied is two or more, by applying the pulse voltage while changing the voltage amplitude Vwp of the pulse voltage, information of different levels can be simultaneously programmed into the multi-value memory cell.

A concrete method of properly controlling a necessary voltage to be applied to the variable resistive element 10 by controlling the gate voltage of the selection transistor 6 will now be described.

Figure 18:
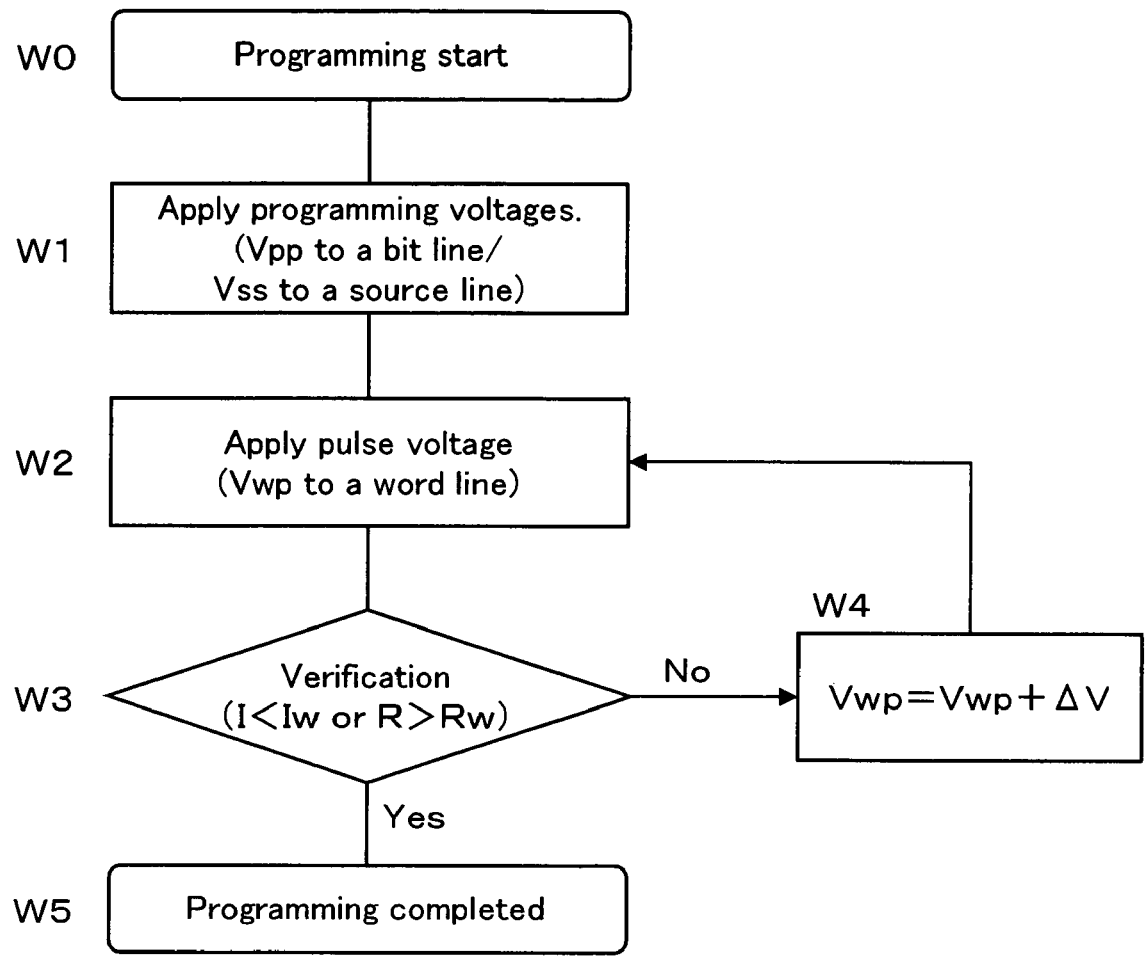
FIG. 18 is a flowchart showing the programming procedure of a memory cell in an embodiment of a control method of the nonvolatile semiconductor memory device according to the present invention.

As shown in the flowchart of FIG. 18, in the case of programming data to an arbitrary memory cell 11 in the memory array 101, first, in step W1, Vpp and Vss are applied to a bit line and a source line, respectively, connected to the memory cell 11. In step W2, the pulse voltage of Vwp is applied to the word line connected to the memory cell 11. After that, a current value or a resistance value (combined resistance of a variable resistive element and a transistor) of the memory cell 11 is read, and whether the read value is equal to or less than a predetermined current value (Iw) or equal to or more than a predetermined resistance value (Rw) is verified (step W3), thereby indirectly determining whether the electric resistance of the variable resistive element 10 reaches a predetermined range (program state) or not. If the electric resistance has reached the range, the programming is finished (step W5). However, if the electric resistance has not reached the range yet, the word line voltage Vwp is increased only by ΔV (step W4), the pulse voltage is applied again (step W2) and, after that, similar verification is performed (step W3). The operation is repeated and application of the voltage pulse (step W2) and the verification (step W3) are performed until the electric resistance has reached the range, and the programming operation is finished.

The method will be concretely described by using measurement results (P4 to P7) in FIG. 10. FIG. 10 shows the relation between the voltage amplitude Vwp at the time of programming of a pulse voltage to be applied to the gate voltage 5 of the selection transistor 6 and a read resistance value after application of the pulse voltage.

First, the bit line voltage Vpp=5.0 V and the source line voltage Vss=0 V are applied and, after that, the pulse voltage Vwp=4.0 V is applied to a word line. Subsequently, the resistance value (combined resistance of the variable resistive element and the selection transistor) is read. Since the read resistance value has not reached a predetermined resistance value (for example, Rw=50 kΩ), Vwp is increased only by 0.5 V and Vwp=4.5 is applied again. Since the resistance value does not reach the predetermined resistance value, Vwp is set to 5.0 V and applied again. However, it does not still reach the predetermined resistance value (Rw=50 kΩ). When Vwp=5.5 V is applied, the resistance value reaches the predetermined resistance value, so that the programming operation is finished.

Figure 19:
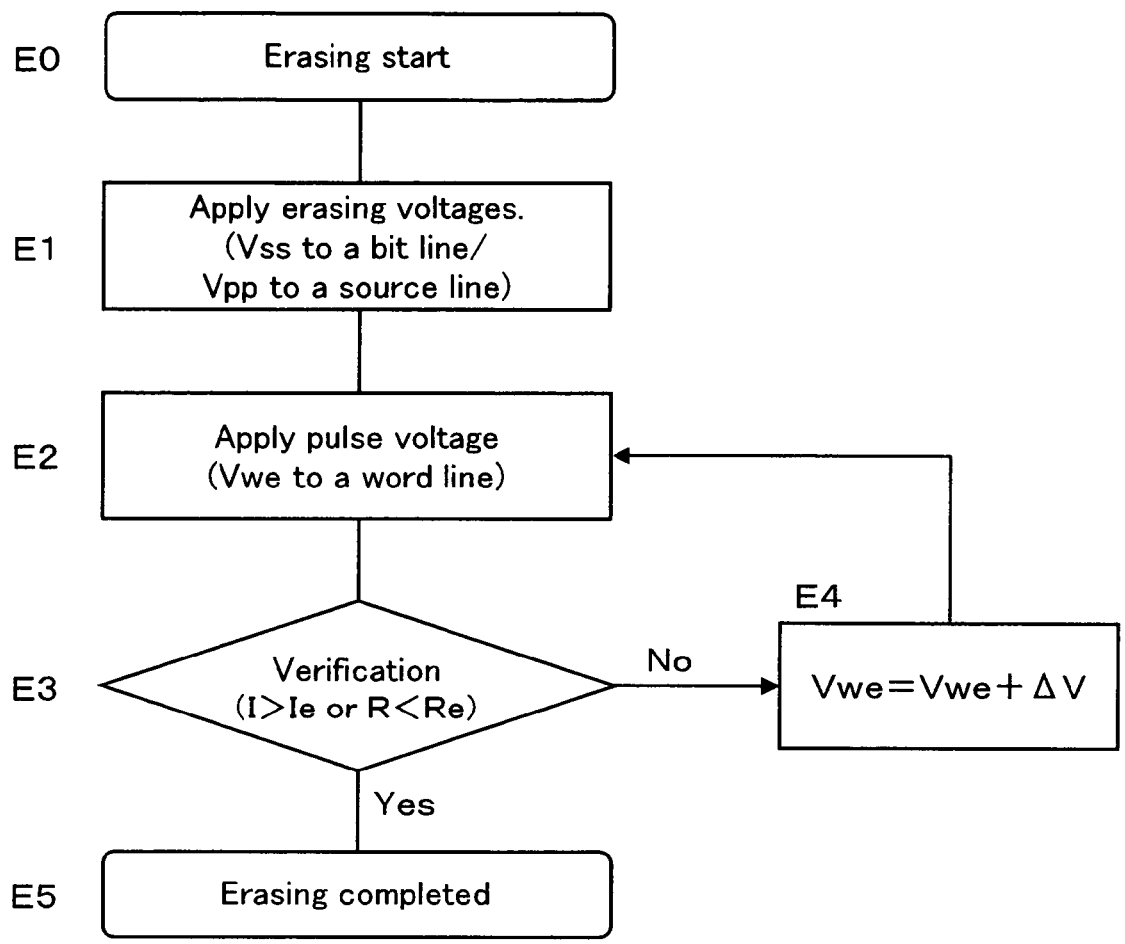
FIG. 19 is a flowchart showing the erasing procedure of a memory cell in an embodiment of the control method of the nonvolatile semiconductor memory device according to the present invention.

The erasing operation can be also performed by a procedure similar to that of the programming operation. As shown in the flowchart of FIG. 19, in the case of erasing data in the arbitrary memory cell 11 in the memory array 101, first, in step E1, Vss and Vpp are applied to a bit line and a source line, respectively, connected to the memory cell 11. In step E2, the pulse voltage of Vwe is applied to the word line connected to the memory cell 11. After that, a current value or a resistance value (combined resistance of a variable resistive element and a selection transistor) of the memory cell 11 is read, and whether the read value is equal to or more than a predetermined current value (Ie) or equal to or less than a resistance value (Re) is verified (step E3), thereby indirectly determining whether the electric resistance of the variable resistive element 10 reaches a predetermined range (erase state) or not. If the electric resistance has reached the range, the erasing operation is finished (step E5). If the electric resistance has not reached the range yet, the word line voltage Vwe is increased only by ΔV (step E4), the pulse voltage is applied again (step E2) and, after that, similar verification is performed (step E3). The operation is repeated, application of the voltage pulse (step E2) and the verification (step E3) are performed until the electric resistance has reached the range, and the erasing operation is finished.

The method will be concretely described by using measurement results (E5 to E7) in FIG. 12. FIG. 12 shows the relation between the voltage amplitude Vwe at the time of erasing with a pulse voltage to be applied to the gate voltage 5 of the selection transistor 6 and a read resistance value after application of the pulse voltage.

First, the bit line voltage Vss=0 V and the source line voltage Vpp=5.0 V are applied and, after that, the pulse voltage Vwe=2.5 V is applied to a word line. Subsequently, the resistance value (combined resistance of the variable resistive element and the selection transistor) is read. Since the read resistance value has not reached a predetermined resistance value (for example, Re=20 kΩ), Vwe is increased only by 0.5 V and Vwe=3.0 V is applied again. The resistance value does not reach the predetermined resistance value in the reading operation performed after the application, so that Vwe is set to 3.5 V and applied again. The resistance value reaches the predetermined resistance value this time and the erasing operation is finished.

Second Embodiment

It has been described above that, in the inventive device and the inventive method according to the first embodiment, at the time of programming and erasing, by independently adjusting the voltage amplitudes Vwp and Vwe of the pulse voltage applied to the gate electrode 5 in the selection transistor 6 in the memory cell 11, the programming and erasing operations can be performed. In the first embodiment, according to the pulse width of the pulse voltage applied to the gate voltage 5, a period in which the memory cell is in the program or erase state is specified. In the inventive device and the inventive method according to a second embodiment, by applying the pulse voltage to one of a bit line and a source line connected to a memory cell to be programmed or erased, the program voltage or erase voltage in pulses to be applied across a bit line and a source line in the first embodiment is applied. During the period, a predetermined word line voltage is applied to a word line connected to the memory cell to be programmed or erased, and the period in which the memory cell 11 enters the program or erase state is specified by the pulse width of a pulse voltage applied to either the bit line or the source line. In this case, in the state where an optimum voltage (word line voltage) is applied to the gate electrode 5 of the selection transistor 6, a pulse voltage is applied to the upper electrode 9 of the variable resistive element 10 or the source region 2 of the selection transistor 6. In the period in which the pulse voltage is applied, voltage conditions of the components (word line, bit line and source line) can be the same as those in the period where the pulse voltage is applied in the first embodiment, so that a result similar to that of the first embodiment can be obtained. In the case where importance is placed on the rising time of the voltage pulse, it can be said that the second embodiment of applying the pulse voltage to a bit line of a small load capacity is more desirable than the first embodiment of applying the pulse voltage to a word line.

Figure 20:
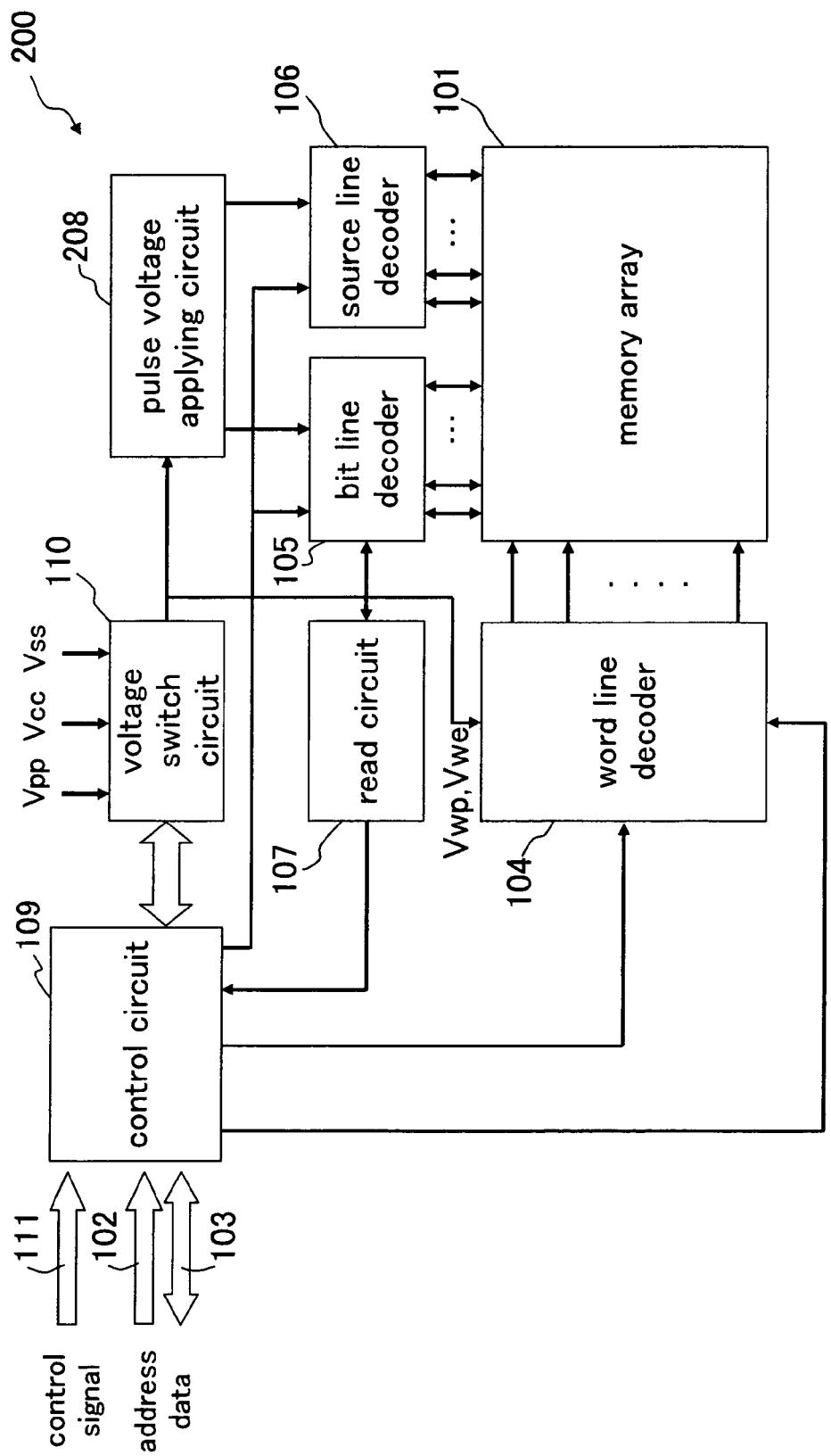
FIG. 20 is a block diagram showing a general configuration in another embodiment of the nonvolatile semiconductor memory device according to the present invention.

FIG. 20 is a block diagram showing an inventive device 200 according to the second embodiment. In the second embodiment, a pulse voltage applying circuit 208 applies a pulse voltage to a bit line selected by the bit line decoder 105 or a source line selected by the source line decoder 106. The pulse voltage applying circuit 208 further has the function capable of applying the same pulse voltage to one or more bit lines or source lines and has the function capable of simultaneously applying pulse voltages of different voltage levels to two or more bit lines or source lines. To the bit lines or source lines to which the pulse voltage is not applied, a program voltage or erase voltage of the voltage switch circuit 110 is applied via the pulse voltage applying circuit 208. To word lines, a predetermined word line voltage (Vwp in the programming operation and Vwe in the erasing operation) is applied by the word line decoder 104 via the voltage switch circuit 110, but is not applied as a pulse voltage specifying the program or erase period. The other circuit configuration is the same as that of the first embodiment and the same reference numeral is given to a circuit having the same function. The voltage switch circuit for word line voltage may be constructed by a circuit different from the voltage switch circuit for switching between the program voltage and the erase voltage of a bit line and a source line. In FIG. 20, both of the circuits are shown as one circuit.

The conditions of applying voltages to the bit line, source line and word line at the time of programming/erasing data to/from the memory array 101 in the inventive device 200 shown in FIG. 20 will now be described.

At the time of programming in the case where the memory array 101 has the memory array configuration shown in FIG. 3, first, the program voltage Vwp and the ground voltage Vss are applied to a selected word line and a not-selected word line, respectively, via the word line decoder 104 and the voltage switch circuit 110. The ground voltage Vss is applied to all of source lines via the source line decoder 106 and the voltage switch circuit 110. After that, the pulse voltage having the voltage amplitude Vpp is applied to a selected bit line via the bit line decoder 105 from the pulse voltage applying circuit 208.

At the time of erasing in the case where the memory array 101 has the same memory array configuration shown in FIG. 3, first, the ground voltage Vss and the erase voltage Vpp are applied to a selected bit line and a not-selected bit line, respectively, via the bit line decoder 105 and the voltage switch circuit 110. The erase voltage Vwe and the ground voltage Vss are applied to a selected word line and a not-selected source line, respectively, via the word line decoder 104 and the voltage switch circuit 110. After that, the pulse voltage having the voltage amplitude Vpp is applied from the pulse voltage applying circuit 208 to a selected source line via the source line decoder 106.

At the time of programming in the case where the memory array 101 has the memory array configuration shown in FIG. 4, first, the program voltage Vwp and the ground voltage Vss are applied to a selected word line and a not-selected word line, respectively, via the word line decoder 104 and the voltage switch circuit 110, and the ground voltage Vss is applied to all of the source lines via the source line decoder 106 and the voltage switch circuit 110. After that, the pulse voltage having the voltage amplitude Vpp is applied to a selected bit line from the pulse voltage applying circuit 208 via the bit line decoder 105.

At the time of erasing in the case where the memory array 101 has the same memory array configuration shown in FIG. 4, first, the ground voltage Vss is applied to all of bit lines via the bit line decoder 105 and the voltage switch circuit 110, the erase voltage Vwe and the ground voltage Vss are applied to a selected word line and a not-selected word line, respectively, via the word line decoder 104 and the voltage switch circuit 110, and the ground voltage Vss is applied to a not-selected source line via the source line decoder 106 and the voltage switch circuit 110. After that, the pulse voltage having the voltage amplitude Vpp is applied from the pulse voltage applying circuit 208 to a selected source line via the source line decoder 106.

It has been described above that data can be programmed/erased to/from the memory array 101 of the inventive device with any of the two kinds of memory array configurations of the different source line arranging methods shown in FIGS. 3 and 4. The number of bit lines or source lines to which the pulse voltage is applied may be one. The pulse voltage may be also applied simultaneously to two or more bit lines or source lines in order to increase the program speed (program throughput) of the inventive device. When the number of word lines to which the word line voltage is to be applied is two or more at the time of programming, by applying the word line voltage while changing the voltage amplitude Vwp of the word line voltage, information of different levels can be simultaneously programmed into the multivalue memory cell.

In the inventive method of the second embodiment, a concrete method of properly controlling a necessary voltage to be applied to the variable resistive element 10 by controlling the pulse voltage to be applied to a bit line or source line connected to a memory cell to be programmed or erased will now be described.

Figure 21:
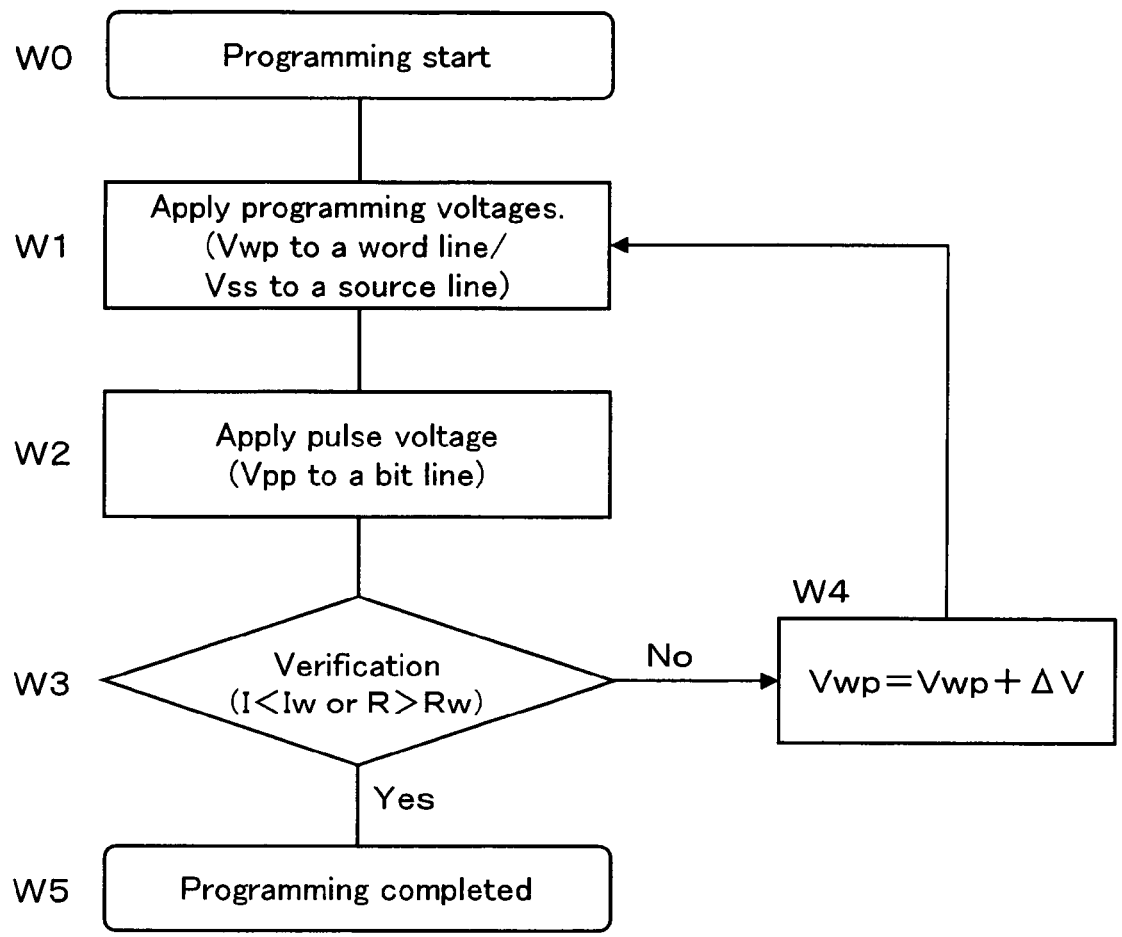
FIG. 21 is a flowchart showing the programming procedure of a memory cell in another embodiment of the control method of the nonvolatile semiconductor memory device according to the present invention.

As shown in the flowchart of FIG. 21, in the case of programming data to an arbitrary memory cell 11 in the memory array 101, first, in step W1, Vwp and Vss are applied to a word line and a source line, respectively, connected to the memory cell 11. In step W2, the pulse voltage of Vpp is applied to the bit line connected to the memory cell 11. After that, a current value or a resistance value (combined resistance of a variable resistive element and a transistor) of the memory cell 11 is read, and whether the read value is equal to or less than a predetermined current value (Iw) or equal to or more than a predetermined resistance value (Rw) is verified (step W3), thereby indirectly determining whether the electric resistance of the variable resistive element 10 reaches a predetermined range (program state) or not. If the electric-resistance reaches the range, the programming operation is finished (step W5). However, if the electric resistance does not satisfy the conditions, a voltage obtained by increasing the word line voltage Vwp only by ΔV in step W4 is applied to the word line in step W1. The pulse voltage is applied again to the bit line (step W2) and verification is performed similarly (step W3). The operation is repeated and application of the word line voltage (step W1), application of the voltage pulse (step W2) and verification (step W3) are performed until the electric resistance reaches the range, and the programming operation is finished.

Figure 22:
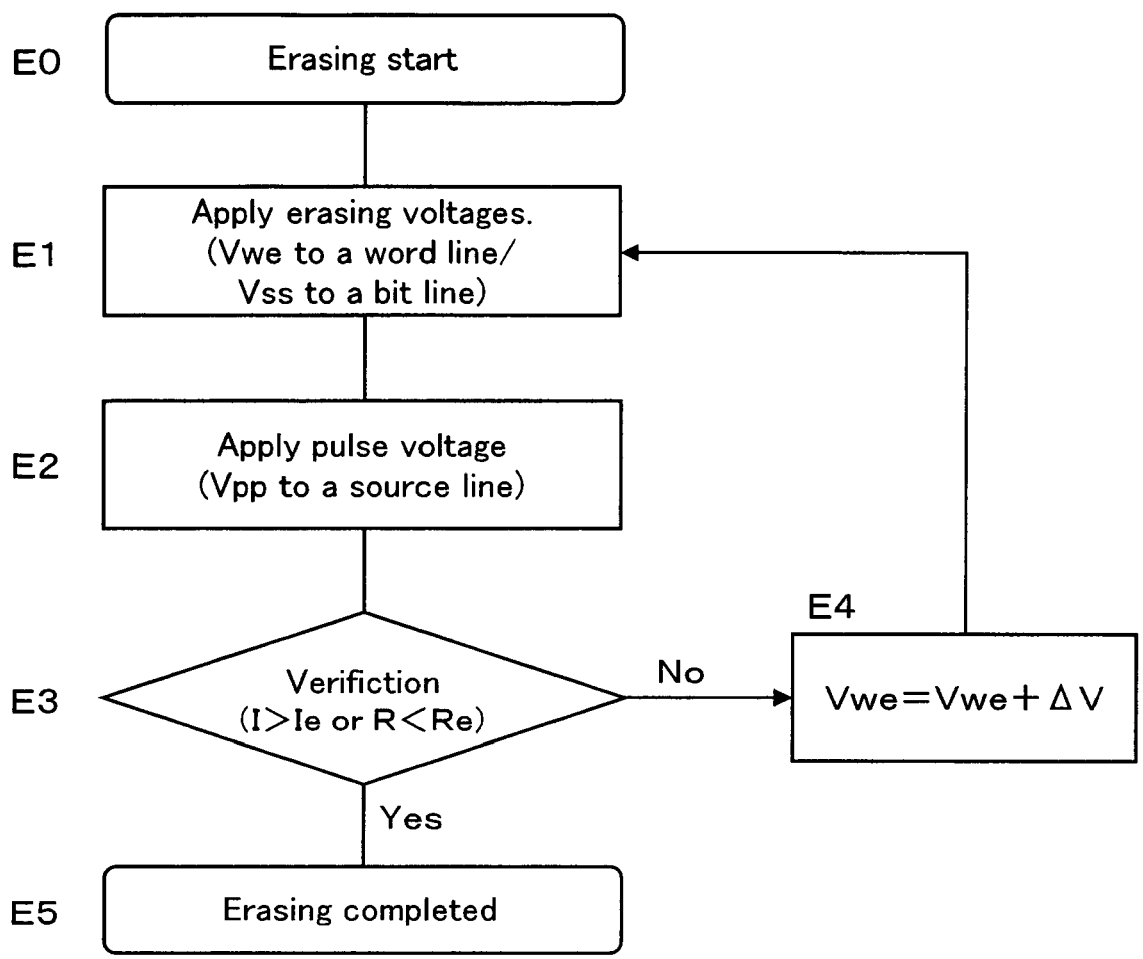
FIG. 22 is a flowchart showing the erasing procedure of a memory cell in another embodiment of the control method of the nonvolatile semiconductor memory device according to the present invention.

The erasing operation can be also performed by a procedure similar to that of the programming operation. As shown in the flowchart of FIG. 22, in the case of erasing data in the arbitrary memory cell 11 in the memory array 101, first, in step E1, Vwe and Vss are applied to a word line and a bit line, respectively, connected to the memory cell 11. In step E2, the pulse voltage of Vpp is applied to the source line connected to the memory cell 11. After that, a current value or a resistance value (combined resistance of a variable resistive element and a selection transistor) of the memory cell 11 is read, and whether the read value is equal to or less than a predetermined current value (Ie) or equal to or more than a resistance value (Re) is verified (step E3), thereby indirectly determining whether the electric resistance of the variable resistive element 10 reaches a predetermined range (erase state) or not. If the electric resistance has reached the range, the erasing is finished (step E5). If the electric resistance has not reached the range yet, a voltage obtained by increasing the word line voltage Vwe only by ΔV in step E4 is applied to the word line in step E1, the pulse voltage is applied again to the source line (step E2) and, after that, similar verification is performed (step E3). The operation is repeated and application of the word line voltage (step E1), application of the voltage pulse (step E2) and the verification (step E3) are performed until the electric resistance reaches the predetermined range, and the erasing operation is finished.

Other Embodiments

In the above embodiments, the memory cell 11 is constructed as shown in FIGS. 2 and 7. The memory cell 11 may be also constructed in such a manner that the source region 2 of the selection transistor 6 and the lower electrode 7 of the variable resistive element 10 are electrically connected to each other, the upper electrode 9 is connected to a source line, the drain region 3 is connected to a bit line, and the position of the selection transistor 6 and that of the variable resistive element 10 are interchanged. By interchanging the positions, the voltage difference (Vpp−Vss) between the upper electrode 9 and the drain region 3 is divided into the voltage Vr applied across both ends of the variable resistive element 10 and the source-drain voltage Vds in a normal state in a manner similar to the memory cell configurations shown in FIGS. 2 and 7.

The inventive device and the inventive method are not limited to an RRAM using an oxide having a perovskite-type crystal structure containing manganese such as PCMO as the variable resistive material, but can be also easily applied to a nonvolatile semiconductor memory device in which a memory cell is constructed by using an element whose resistance value changes according to application of a voltage as a memory carrier.

The voltage values, resistance values and current values concretely shown in the above embodiments are just examples and the present invention is not limited to the concrete values.

As described in detail above, in the nonvolatile semiconductor memory device and the control method thereof according to the present invention, by applying voltages to a bit line and a source line and, after that, adjusting the voltage amplitude of a pulse voltage to be applied to a word line, the voltage applied to the variable resistive element can be adjusted with high precision. As a result, an excessive voltage is not applied to the variable resistive element at the time of programming/erasing, so that the programming and erasing operations can be performed with a small current amount. Since the voltage applied to the variable resistive element can be adjusted with high precision, the resistance value of the variable resistive element can be also controlled with high precision. Thus, the present invention can provide the nonvolatile semiconductor memory device and the control method thereof optimum to be used for a multivalue memory cell which is sensitive to variations in the resistance value and stores multivalue information of two or more bits.

Further, in the nonvolatile semiconductor memory device and the control method thereof according to the present invention, by using the verifying operation, the amplitude of the word line voltage to be applied at the time of programming and erasing can be easily adjusted. As a result, the voltage applied to the variable resistive element can be adjusted with high precision. At the time of programming and erasing, an excessive voltage is not applied to the variable resistive element, and programming and erasing can be performed with a small current amount.

Although the present invention has been described in terms of preferred embodiments, it will be appreciated that various modifications and alterations might be made by those skilled in the art without departing from the spirit and scope of the invention. The invention should therefore be measured in terms of the claims which follow.

What is claimed is:

1. A nonvolatile semiconductor memory device comprising:
   a memory array in which a plurality of memory cells are arranged in a row direction and a column direction, each of the memory cells being formed by connecting one end of a variable resistive element for storing information according to a change in electric resistance caused by an electric stress and a drain of a selection transistor to each other on a semiconductor substrate;
   a word line connected to gates of the selection transistors of the plurality of memory cells in the same row;
   a source line connected to sources of the selection transistors of the plurality of memory cells in the same row or the same column;
   a bit line connected to the other ends of the variable resistive elements of the plurality of memory cells in the same column;
   a control circuit for executing controls of programming, erasing and reading of information to/from the memory cell;

a voltage switch circuit for switching among a program voltage, an erase voltage and a read voltage to be applied to the source line and the bit line;

a read circuit for reading information from the memory cell; and a pulse voltage applying circuit for applying a voltage pulse for programming or erasing to the word line connected to the memory cell in the state where the program voltage or erase voltage corresponding to the bit line and the source line is applied to the bit line and the source line connected to the memory cell to be programmed or erased in the memory array via the voltage switch circuit.

2. The nonvolatile semiconductor memory device according to claim 1, wherein the pulse voltage applying circuit generates a voltage pulse of a voltage value adjusted for programming at the time of programming and generates a voltage pulse of a voltage value adjusted for erasing at the time of erasing.

3. The nonvolatile semiconductor memory device according to claim 2, wherein when the voltage pulse generated by the pulse voltage applying circuit is applied to the gate of the selection transistor in the memory cell to be programmed or erased, a voltage value obtained by subtracting a drain-source voltage of the selection transistor from an absolute value of a voltage difference between the program voltage or the erase voltage applied to the bit line and the source line is set to be larger than either a program threshold voltage necessary for programming data to the variable resistive element or an erase threshold voltage necessary for erasing data in the variable resistive element.

4. The nonvolatile semiconductor memory device according to claim 2, wherein the voltage value of the voltage pulse is set so that the selection transistor operates in a saturation region at least in a period in the application period of the voltage pulse when the voltage pulse is applied to the gate of the selection transistor of the memory cell to be programmed or erased.

5. The nonvolatile semiconductor memory device according to claim 1, wherein the pulse voltage applying circuit has the function capable of simultaneously applying the voltage pulse to one or more word lines.

6. The nonvolatile semiconductor memory device according to claim 1, wherein the pulse voltage applying circuit has the function capable of simultaneously applying the pulse voltages of different voltage values to at least two word lines at the time of programming.

7. The nonvolatile semiconductor memory device according to claim 1, wherein the variable resistive element is made of an oxide having a perovskite-type crystal structure containing manganese.

8. The nonvolatile semiconductor memory device according to claim 1, wherein a current-voltage characteristic of the variable resistive element has a Poole-Frenkele type nonlinear electric conduction characteristic.

9. The nonvolatile semiconductor memory device according to claim 1, wherein the source line and the bit line are disposed in parallel with each other in the memory cell.

10. The nonvolatile semiconductor memory device according to claim 1, wherein the source line and the word line are disposed in parallel with each other in the memory cell.

11. The nonvolatile semiconductor memory device according to claim 1, wherein the variable resistive element can store information of two or more values which can be read.

12. A nonvolatile semiconductor memory device comprising:

a memory array in which a plurality of memory cells are arranged in a row direction and a column direction, each of the memory cells being formed by connecting one end of a variable resistive element for storing information according to a change in electric resistance caused by an electric stress and a drain of a selection transistor to each other on a semiconductor substrate;

a word line connected to gates of the selection transistors of the plurality of memory cells in the same row;

a source line connected to sources of the selection transistors of the plurality of memory cells in the same row or the same column;

a bit line connected to the other ends of the variable resistive elements of the plurality of memory cells in the same column;

a control circuit for executing controls of programming, erasing and reading of information to/from the memory cell;

a voltage switch circuit for switching among a program voltage, an erase voltage and a read voltage to be applied to the word line, the source line and the bit line;

a read circuit for reading information from the memory cell; and a pulse voltage applying circuit for applying a voltage pulse for programming or erasing to the bit line or the source line which is connected to the memory cell and to which the program voltage or erase voltage is not applied in the state where the program voltage or erase voltage is applied to one of the bit line and the source line and the word line connected to the memory cell to be programmed or erased in the memory array via the voltage switch circuit.

13. The nonvolatile semiconductor memory device according to claim 12, wherein the pulse voltage applying circuit has the function capable of simultaneously applying the voltage pulse to one or more bit lines or source lines.

14. The nonvolatile semiconductor memory device according to claim 12, wherein means for applying the program voltage to the word line has the function capable of simultaneously applying the program voltages of different voltage values to at least two word lines at the time of programming.

15. The nonvolatile semiconductor memory device according to claim 12, wherein the variable resistive element is made of an oxide having a perovskite-type crystal structure containing manganese.

16. The nonvolatile semiconductor memory device according to claim 12, wherein a current-voltage characteristic of the variable resistive element has a Poole-Frenkele type nonlinear electric conduction characteristic.

17. The nonvolatile semiconductor memory device according to claim 12, wherein the source line and the bit line are disposed in parallel with each other in the memory cell.

18. The nonvolatile semiconductor memory device according to claim 12, wherein
the source line and the word line are disposed in parallel with each other in the memory cell.

19. The nonvolatile semiconductor memory device according to claim 12, wherein
the variable resistive element can store information of two or more values which can be read.

20. A control method of a nonvolatile semiconductor memory device, wherein
the nonvolatile semiconductor memory device comprises at least:
a memory array in which a plurality of memory cells are arranged in a row direction and a column direction, each of the memory cells being formed by connecting one end of a variable resistive element for storing information according to a change in electric resistance caused by an electric stress and a drain of a selection transistor to each other on a semiconductor substrate;
a word line connected to gates of the selection transistors of the plurality of memory cells in the same row;
a source line connected to sources of the selection transistors of the plurality of memory cells in the same row or the same column;
a bit line connected to the other ends of the variable resistive elements of the plurality of memory cells in the same column;
a control circuit for executing controls of programming, erasing and reading of information to/from the memory cell;
a voltage switch circuit for switching among a program voltage, an erase voltage and a read voltage to be applied to the source line and the bit line; and
a read circuit for reading information from the memory cell, and
in a programming or erasing operation, in the state where the program voltage or erase voltage corresponding to the bit line and the source line is applied to the bit line and the source line connected to the memory cell to be programmed or erased in the memory array via the voltage switch circuit, a voltage pulse for programming or erasing is applied to the word line connected to the memory cell.

21. The control method according to claim 20, comprising:
a first step of applying a voltage pulse for programming or erasing to the word line connected to the memory cell in the state where the program voltage or erase voltage corresponding to the bit line and the source line is applied to the bit line and the source line connected to the memory cell to be programmed or erased in the memory array via the voltage switch circuit;
a second step of determining whether electric resistance of the variable resistive element in the memory cell reaches a predetermined range or not;
a third step of performing application of voltage again in the first step under a voltage application condition different from that in the first step in the case where the electric resistance has not reached the predetermined range; and
a fourth step of repeating the second and third steps until the electric resistance reaches the predetermined range.

22. The control method according to claim 21, wherein the voltage amplitude of the voltage pulse in the third step is larger than that in the first step.

23. The control method according to claim 20, wherein
in the case of applying a voltage pulse for programming or erasing to the word line, a voltage pulse of a voltage value adjusted for programming is generated at the time of programming, and a voltage pulse of a voltage value adjusted for erasing is generated at the time of erasing.

24. The control method according to claim 23, wherein
when the voltage pulse is applied to the gate of the selection transistor in the memory cell to be programmed or erased, a voltage value obtained by subtracting a drain-source voltage of the selection transistor from an absolute value of a voltage difference between the program voltage or the erase voltage applied to the bit line and the source line is set to be larger than either a program threshold voltage necessary for programming data to the variable resistive element or an erase threshold voltage necessary for erasing data in the variable resistive element.

25. The control method according to claim 23, wherein
the voltage value of the voltage pulse is set so that the selection transistor operates in a saturation region at least in a period in the application period of the voltage pulse when the voltage pulse is applied to the gate of the selection transistor of the memory cell to be programmed or erased.

26. The control method according to claim 20, wherein
means for applying the voltage pulse to the word line simultaneously applies the voltage pulse to one or more word lines.

27. The control method according to claim 20, wherein
at the time of programming, the means for applying the voltage pulse to the word line simultaneously applies the voltage pulses of voltage values respectively selected among a plurality of voltage values to two or more word lines.

28. The control method according to claim 20, wherein
the variable resistive element can store information of two or more values which can be read.

29. The control method according to claim 20, wherein
a pulse time width of the voltage pulse is equal to or less than 100 microseconds and is equal to or more than 10 nanoseconds.

30. A control method of a nonvolatile semiconductor memory device, wherein
the nonvolatile semiconductor memory device comprises at least:
a memory array in which a plurality of memory cells are arranged in a row direction and a column direction, each of the memory cells being formed by connecting one end of a variable resistive element for storing information according to a change in electric resistance caused by an electric stress and a drain of a selection transistor to each other on a semiconductor substrate;
a word line connected to gates of the selection transistors of the plurality of memory cells in the same row;
a source line connected to sources of the selection transistors of the plurality of memory cells in the same row or the same column;
a bit line connected to the other ends of the variable resistive elements of the plurality of memory cells in the same column;
a control circuit for executing controls of programming, erasing and reading of information to/from the memory cell;

a voltage switch circuit for switching among a program voltage, an erase voltage and a read voltage to be applied to the word line, the source line and the bit line; and a read circuit for reading information from the memory cell, and in a programming or erasing operation, in the state where the program voltage or erase voltage is applied to one of the bit line and the source line and the word line connected to the memory cell to be programmed or erased in the memory array via the voltage switch circuit, a voltage pulse for programming or erasing is applied to the bit line or the source line which is connected to the memory cell and to which the program voltage or erase voltage is not applied.

31. The control method according to claim 30, wherein means for applying the voltage pulse to the bit line or the source line simultaneously applies the voltage pulse to one or more bit lines or source lines.

32. The control method according to claim 30, wherein means for applying the program voltage to the word line simultaneously applies the program voltages of different voltage values respectively selected from a plurality of voltage values to at least two word lines at the time of programming.

33. The control method according to claim 30, comprising:

a first step of applying a voltage pulse for programming or erasing to the bit line or the source line which is connected to the memory cell and to which the program voltage or erase voltage is not applied in the state where the program voltage or erase voltage corresponding to the bit line or the source line is applied to one of the bit line and the source line and the word line connected to the memory cell to be programmed or erased in the memory array via the voltage switch circuit;

a second step of determining whether electric resistance of the variable resistive element in the memory cell reaches a predetermined range or not;

a third step of performing application of voltage again in the first step under a voltage application condition different from that in the first step in the case where the electric resistance has not reached the predetermined range; and a fourth step of repeating the second and third steps until the electric resistance reaches the predetermined range.

34. The control method according to claim 33, wherein the voltage applied to the word line in the third step is larger than that in the first step.

35. The control method according to claim 30, wherein the variable resistive element can store information of two or more values which can be read.

36. The control method according to claim 30, wherein a pulse time width of the voltage pulse is equal to or less than 100 microseconds and is equal to or more than 10 nanoseconds.

* * * * *